(12) United States Patent
Umeda et al.

(10) Patent No.: US 11,315,899 B2
(45) Date of Patent: Apr. 26, 2022

(54) DIE BONDING MATERIAL, LIGHT-EMITTING DEVICE, AND METHOD FOR PRODUCING LIGHT-EMITTING DEVICE

(71) Applicants: LINTEC CORPORATION, Tokyo (JP); NICHIA CORPORATION, Tokushima (JP)

(72) Inventors: Akiko Umeda, Tokyo (JP); Manabu Miyawaki, Tokyo (JP); Hidekazu Nakayama, Tokyo (JP); Hiroki Inoue, Anan (JP); Toshifumi Imura, Anan (JP)

(73) Assignees: LINTEC CORPORATION, Tokyo (JP); NICHIA CORPORATION, Anan (JP)

( * ) Notice: Subject to any disclaimer, the term of this patent is extended or adjusted under 35 U.S.C. 154(b) by 244 days.

(21) Appl. No.: 16/851,330

(22) Filed: Apr. 17, 2020

(65) Prior Publication Data
US 2020/0335471 A1    Oct. 22, 2020

(30) Foreign Application Priority Data

Apr. 18, 2019  (JP) .............................. JP2019-079617

(51) Int. Cl.
| | |
|---|---|
| *H01L 23/00* | (2006.01) |
| *H01L 33/62* | (2010.01) |
| *C09J 183/04* | (2006.01) |
| *C08G 77/388* | (2006.01) |

(52) U.S. Cl.
CPC ............ *H01L 24/29* (2013.01); *C08G 77/388* (2013.01); *C09J 183/04* (2013.01); *H01L 24/73* (2013.01); *H01L 24/83* (2013.01); *H01L 33/62* (2013.01); *H01L 2224/29191* (2013.01); *H01L 2224/73265* (2013.01); *H01L 2224/83855* (2013.01); *H01L 2924/0715* (2013.01); *H01L 2933/0066* (2013.01)

(58) Field of Classification Search
CPC .................... H01L 24/83; H01L 24/32; H01L 2224/73265; H01L 2224/83855; H01L 2224/8385; H01L 2224/84862; H01L 2224/8592; C09J 183/08; C08G 77/06; C08G 77/24; C08K 5/541; C08K 5/544; C08K 3/36; C08L 83/04; C08L 83/08; C09K 3/1018; C09D 183/08
See application file for complete search history.

(56) References Cited

U.S. PATENT DOCUMENTS

2018/0355111 A1    12/2018 Nanashima et al.

FOREIGN PATENT DOCUMENTS

| | | |
|---|---|---|
| JP | 2004-359933 A | 12/2004 |
| JP | 2005-263869 A | 9/2005 |
| JP | 2006-328231 A | 12/2006 |
| WO | WO 2017/110948 A1 | 6/2017 |

*Primary Examiner* — David A Zarneke
(74) *Attorney, Agent, or Firm* — Birch, Stewart, Kolasch & Birch, LLP

(57) ABSTRACT

The present invention provides a die bonding material containing the following component (A) and a solvent and having a refractive index (nD) at 25° C. of 1.41 to 1.43 and a thixotropic index of 2 or more, a light-emitting device including an adhesive member derived from the die bonding material, and a method for producing the light-emitting device. The die bonding material of the present invention is preferably used for fixing a light emitting element at a predetermined position.

Component (A): a curable polysilsesquioxane compound having a repeating unit represented by the following formula (a-1) and satisfying predetermined requirements related to $^{29}$Si-NMR and mass average molecular weight (Mw)

$$R^1\text{-}D\text{-}SiO_{3/2} \qquad (a\text{-}1)$$

[wherein $R^1$ represents a fluoroalkyl group represented by a compositional formula: $C_mH_{(2m-n+1)}F_n$; m represents an integer of 1 to 10, and n represents an integer of 2 to (2m+1); and D represents a linking group (excluding an alkylene group) for connecting $R^1$ and Si, or a single bond].

15 Claims, 3 Drawing Sheets

DIE BONDING MATERIAL, LIGHT-EMITTING DEVICE, AND METHOD FOR PRODUCING LIGHT-EMITTING DEVICE

BACKGROUND

1. Technical Field

The present invention relates to a die bonding material suitably used for fixing a light emitting element at a predetermined position, a light-emitting device including an adhesive member derived from the die bonding material, and a method for producing the light-emitting device.

2. Description of the Related Art

Conventionally, curable compositions have been variously improved depending on the application, and have been widely used industrially as raw materials for optical components and molds, adhesives, coating agents, and the like.

In particular, curable compositions containing a silicone-based compound have been a focus of attention as sealing materials for light emitting elements, die bonding materials for light emitting elements, and the like.

For example, Patent Literatures 1 to 4 describe polysilsesquioxane-compound-containing curable compositions as curable compositions suitably used for producing light-emitting devices.

CITATION LIST

Patent Literature

Patent Literature 1: JP-A-2004-359933
Patent Literature 2: JP-A-2005-263869
Patent Literature 3: JP-A-2006-328231
Patent Literature 4: WO 2017/110948 (US 2018/0355111 A1)

SUMMARY

Technical Problem

An object of the present invention is to provide a higher-performance die bonding material, a higher-performance light-emitting device, and a method for producing the light-emitting device.

In other words, the object of the present invention is to provide a die bonding material suitably used for fixing a light emitting element at a predetermined position, a light-emitting device including an adhesive member derived from the die bonding material, and a method for producing the light-emitting device.

Solution to Problem

The present inventors repeated intensive studies about a die bonding material containing a curable polysilsesquioxane compound in order to solve the above-mentioned problem.

As a result, the inventors have found that a die bonding material containing a specific curable polysilsesquioxane compound and a solvent and satisfying predetermined requirements related to a refractive index (nD) and a thixotropy index is excellent in spreadability, is capable of firmly fixing a light emitting element, and contributes to the enhancement of the optical extraction efficiency of a light-emitting device, and this finding has led to the completion of the present invention.

Thus, one aspect of the present invention provides die bonding materials of the following [1] to [9], light-emitting devices of [10] to [12], and methods for the light-emitting device of [13] to [15].

[1] A die bonding material containing the following component (A) and a solvent, and having a refractive index (nD) at 25° C. of 1.41 to 1.43 and a thixotropic index of 2 or more, Component (A): a curable polysilsesquioxane compound having a repeating unit represented by the following formula (a-1) and satisfying the following requirement 1 and requirement 2,

$$R^1\text{-D-SiO}_{3/2} \quad (a\text{-}1)$$

[wherein $R^1$ represents a fluoroalkyl group represented by a compositional formula: $C_mH_{(2m-n+1)}F_n$; m represents an integer of 1 to 10, and n represents an integer of 2 to (2m+1); and D represents a linking group (excluding an alkylene group) for connecting $R^1$ and Si, or a single bond],

[Requirement 1]

as a result of measuring a $^{29}$Si-NMR of the curable polysilsesquioxane compound, one or two or more peaks are observed in a region [region (2)] of −62 ppm or more and less than −52 ppm, one or two or more peaks are observed in at least one region of a region [region (1)] of −52 ppm or more and less than −45 ppm and a region [region (3)] of −73 ppm or more and less than −62 ppm, and Z2 determined by the following formula is 20% to 40%, $$Z2 = \frac{P2}{P1+P2+P3} \times 100$$

P1: an integrated value in the region (1)
P2: an integrated value in the region (2)
P3: an integrated value in the region (3)

[Requirement 2]

the curable polysilsesquioxane compound has a mass average molecular weight (Mw) of 4,000 to 11,000.

[2] The die bonding material according to [1], wherein the curable polysilsesquioxane compound has a ratio of the repeating unit represented by the formula (a-1) of 25 mol % or higher, based on a total amount of repeating units.

[3] The die bonding material according to [1] or [2], wherein the curable polysilsesquioxane compound further includes a repeating unit represented by the following formula (a-2),

$$R^2\text{SiO}_{3/2} \quad (a\text{-}2)$$

[wherein $R^2$ represents an unsubstituted alkyl group having 1 to 10 carbon atoms, or an aryl group having 6 to 12 carbon atoms with or without a substituent].

[4] The die bonding material according to [3], wherein the curable polysilsesquioxane compound has a ratio of the repeating unit represented by the formula (a-2) of higher than 0 mol % and 75 mol % or lower, based on a total amount of repeating units.

[5] The die bonding material according to any one of [1] to [4], wherein, as a result of measuring the $^{29}$Si-NMR of the curable polysilsesquioxane compound, one or two or more peaks are observed in the region (3), and Z3 determined by the following formula is 60% to 80%, $$Z3 = \frac{P3}{P1 + P2 + P3} \times 100.$$

[6] The die bonding material according to any one of [1] to [5], further comprising the following component (B):
Component (B): a silane coupling agent having a nitrogen atom in a molecule of the silane coupling agent.
[7] The die bonding material according to any one of [1] to [6], further comprising the following component (C):
Component (C): a silane coupling agent having an acid anhydride structure in a molecule of the silane coupling agent.
[8] The die bonding material according to any one of [1] to [7], further comprising the following component (D):
Component (D): fine particles having an average primary particle diameter of 5 to 40 nm.
[9] The die bonding material according to any one of [1] to [8], the die bonding material satisfies the following requirement 3:
[Requirement 3]
as a result of measuring a solid-state Si nuclear magnetic resonance spectrum of a cured product of the die bonding material, a peak is observed in a region of −80 ppm or more and less than −40 ppm, and a half-width of the peak is 500 Hz or more and 900 Hz or less.
[10] A light-emitting device including:
an element-housing including a pair of lead electrodes and a mold integrally formed with the pair of lead electrodes, and having a recess, the pair of lead electrodes constituting a bottom of the recess; and
a light emitting element fixed, with an adhesive member, onto at least one of the pair of lead electrodes constituting the bottom of the recess, wherein
the adhesive member is a cured product of the die bonding material according to any one of [1] to [9].
[11] The light-emitting device according to [10], wherein the light emitting element has a light emission peak wavelength of 445 nm or more and 465 nm or less.
[12] The light-emitting device according to [10] or [11], wherein the light emitting element contains a nitride semiconductor ($In_xAl_yGa_{1-x-y}N$, $0 \leq x$, $0 \leq y$, $x+y \leq 1$).
[13] A method for producing a light-emitting device that includes:
an element-housing including a pair of lead electrodes and a mold integrally formed with the pair of lead electrodes, and having a recess, the pair of lead electrodes constituting a bottom of the recess; and
a light emitting element fixed, with an adhesive member, onto at least one of the pair of lead electrodes constituting the bottom of the recess,
the method including mounting a light emitting element by fixing the light emitting element to at least one of the pair of lead electrodes by using the die bonding material according to any one of [1] to [9].
[14] The method for producing a light-emitting device according to [13], wherein the step of mounting the light emitting element includes:
applying the die bonding material to at least one of the pair of lead electrodes;
disposing the light emitting element on the die bonding material; and
curing the die bonding material at a temperature of 130° C. or higher and 140° C. or lower.
[15] The method for producing a light emitting-device according to [13] or [14], wherein the light emitting element has a light emission peak wavelength of 445 nm or more and 465 nm or less.

Advantageous Effects of Invention

One aspect according to one embodiment of the present invention provides a die bonding material suitably used for fixing a light emitting element at a predetermined position, a light-emitting device including an adhesive member derived from the die bonding material, and a method for producing the light-emitting device.

DETAILED DESCRIPTION OF EMBODIMENTS

Figure 1:
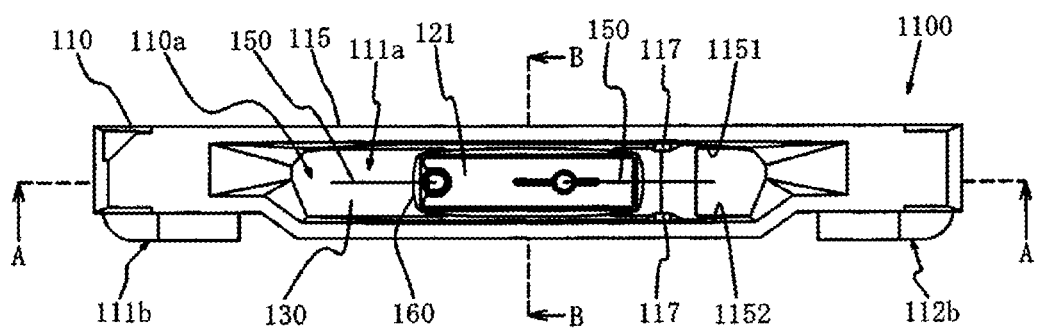
FIG. 1 is a schematic elevation view of a light-emitting device according to one embodiment of the present invention.

Hereinafter, the embodiments of the present invention will be classified into 1) a die bonding material, 2) a light-emitting device, and 3) a method for producing the light-emitting device, and described in detail.
1) Die Bonding Material
The die bonding material of the present invention contains the following component (A) and a solvent, and has a refractive index (nD) at 25° C. of 1.41 to 1.43 and a thixotropic index of 2 or more.
Component (A): a curable polysilsesquioxane compound having a repeating unit represented by the above formula (a-1) and satisfying the above-described requirement 1 and requirement 2 [curable polysilsesquioxane compound (A)]
In the present invention, the "curable polysilsesquioxane compound" refers to a polysilsesquioxane compound that independently changes into a cured product by satisfying predetermined conditions such as heating or a polysilsesquioxane compound that functions as a curable component in a curable composition (die bonding material).
[Component (A)]
The component (A) constituting the die bonding material of the present invention is a curable polysilsesquioxane compound having a repeating unit represented by the following formula (a-1) and satisfying the above-described requirement 1 and requirement 2.

$R^1$-D-$SiO_{3/2}$ (a-1)

[wherein, $R^1$ represents a fluoroalkyl group represented by a compositional formula: $C_mH_{(2m-n+1)}F_n$; m represents an integer of 1 to 10, and n represents an integer of 2 to (2m+1); and D represents a linking group (excluding an alkylene group) for connecting $R^1$ and Si or, a single bond].

In the formula (a-1), $R^1$ represents a fluoroalkyl group represented by the compositional formula: $C_mH_{2m-n+1)}F_n$. m represents an integer of 1 to 10, and n represents an integer of 2 to (2m+1). m represents an integer of preferably 1 to 5, and more preferably 1 to 3.

The use of the curable polysilsesquioxane compound having $R^1$ allows a die bonding material having a low refractive index to be obtained.

Examples of the fluoroalkyl group represented by the compositional formula: $C_mH_{(2m-n+1)}F_n$ include a perfluoroalkyl group such as $CF_3$, $CF_3CF_2$, $CF_3(CF_2)_2$, $CF_3(CF_2)_3$, $CF_3(CF_2)_4$, $CF_3(CF_2)_5$, $CF_3(CF_2)_6$, $CF_3(CF_2)_7$, $CF_3(CF_2)_8$, and $CF_3(CF_2)_9$; and a hydrofluoroalkyl group such as $CF_3CH_2CH_2$, $CF_3(CF_2)_3CH_2CH_2$, $CF_3(CF_2)_5CH_2CH_2$, and $CF_3(CF_2)_7CH_2CH_2$.

In the formula (a-1), D represents a linking group (excluding an alkylene group) for connecting $R^1$ and Si, or a single bond.

Examples of the linking group as D include an arylene group having 6 to 20 carbon atoms, such as a 1,4-phenylene group, a 1,3-phenylene group, a 1,2-phenylene group, or a 1,5-naphthylene group.

The curable polysilsesquioxane compound (A) may be a polymer (homopolymer) having one kind of ($R^1$-D) or a polymer (copolymer) having two or more kinds of ($R^1$-D).

In the case where the curable polysilsesquioxane compound (A) is a copolymer, the curable polysilsesquioxane compound (A) may be any of a random copolymer, a block copolymer, a graft copolymer, an alternating copolymer, and the like, but, from the viewpoint of production easiness and the like, a random copolymer is preferred.

The structure of the curable polysilsesquioxane compound (A) may be any of a ladder-type structure, a double decker-type structure, a cage-type structure, a partial cleavage cage-type structure, a ring-type structure, and a random-type structure.

The ratio of the repeating unit contained in the curable polysilsesquioxane compound (A) and represented by the formula (a-1) is preferably 25 mol % or higher, more preferably 25 to 90 mol %, and still more preferably 25 to 85 mol %, based on the total amount of repeating units.

The use of the curable polysilsesquioxane compound (A) in which the ratio of the repeating unit represented by the formula (a-1) is 25 mol % or higher based on the total amount of repeating units allows a die bonding material having a lower refractive index to be obtained.

The curable polysilsesquioxane compound (A) may further have a repeating unit represented by the following formula (a-2) (that is, the curable polysilsesquioxane compound (A) is a copolymer).

In the formula (a-2), $R^2$ represents an unsubstituted alkyl group having 1 to 10 carbon atoms, or an aryl group having 6 to 12 carbon atoms with or without substituents.

Examples of the unsubstituted alkyl group having 1 to 10 carbon atoms represented by $R^2$ include a methyl group, an ethyl group, an n-propyl group, an isopropyl group, an n-butyl group, an isobutyl group, an s-butyl group, a t-butyl group, an n-pentyl group, an n-hexyl group, an n-octyl group, an n-nonyl group, and an n-decyl group.

Examples of the unsubstituted aryl group having 6 to 12 carbon atoms represented by $R^2$ include a phenyl group, a 1-naphthyl group, and a 2-naphthyl group.

Examples of the substituent in the aryl group having substituents and 6 to 12 carbon atoms represented by $R^2$ include an alkyl group such as a methyl group, an ethyl group, an n-propyl group, an isopropyl group, an n-butyl group, an s-butyl group, an isobutyl group, a t-butyl group, an n-pentyl group, an n-hexyl group, an n-heptyl group, an n-octyl group, and an isooctyl group; a halogen atom such as a fluorine atom, a chlorine atom, and a bromine atom; and an alkoxy group such as a methoxy group and an ethoxy group.

Above all, $R^2$ is preferably an unsubstituted alkyl group having 1 to 10 carbon atoms, more preferably an unsubstituted alkyl group having 1 to 6 carbon atoms, and particularly preferably an unsubstituted alkyl group having 1 to 3 carbon atoms because, with such $R^2$, a cured product having higher adhesive strength and being more excellent in heat resistance can be easily obtained.

In the case where the curable polysilsesquioxane compound (A) has a repeating unit represented by the formula (a-2), the curable polysilsesquioxane compound (A) may have one kind of $R^2$ or two or more kinds of $R^2$.

In the case where the curable polysilsesquioxane compound (A) has a repeating unit represented by the formula (a-2), the ratio of the repeating unit is preferably higher than 0 mol % and 75 mol % or lower, more preferably 10 to 75 mol %, and still more preferably 15 to 75 mol %, based on the total amount of repeating units.

The use of the curable polysilsesquioxane compound (A) in which the ratio of the repeating unit represented by the formula (a-2) is in the above-mentioned range allows a cured product having higher adhesive strength and being more excellent in heat resistance to be easily obtained.

The ratios of the repeating units represented by the formula (a-1) and the formula (a-2) in the curable polysilsesquioxane compound (A) can be determined by, for example, measuring the $^{29}$Si-NMR of the curable polysilsesquioxane compound (A).

The curable polysilsesquioxane compound (A) is soluble in various organic solvents, such as: ketone-based solvents such as acetone; aromatic hydrocarbon-based solvents such as benzene; sulfur-containing solvents such as dimethylsulfoxide; ether-based solvents such as tetrahydrofuran; ester-based solvents such as ethyl acetate; halogen-containing solvents such as chloroform; and mixed solvents including two or more kinds of the above-mentioned solvents, and therefore, by using the above-mentioned solvents, the $^{29}$Si-NMR of the curable polysilsesquioxane compound (A) in a solution state can be measured.

The repeating unit represented by the formula (a-1) and the repeating unit represented by the formula (a-2) are represented by the following formula (a-3).

[wherein G represents ($R^1$-D) or $R^2$; $R^1$, D, and $R^2$ independently represent the same as described above; and $O_{1/2}$ indicates that an oxygen atom is shared with an adjacent repeating unit].

As illustrated in the formula (a-3), the curable polysilsesquioxane compound (A) has a partial structure generally called a T-site in which three oxygen atoms bind to a silicon atom and another group (a group represented as G) binds to the silicon atom.

Examples of the T site included in the curable polysilsesquioxane compound (A) include sites represented by the following formulae (a-4) to (a-6).

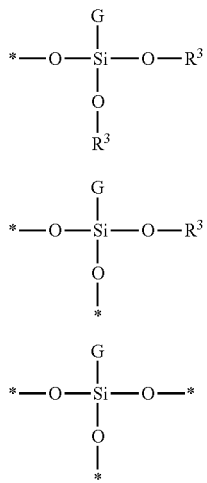

In the formulae (a-4), (a-5), and (a-6), G represents the same as described above. $R^3$ represents a hydrogen atom or an alkyl group having 1 to 10 carbon atoms. Examples of the alkyl group having 1 to 10 carbon atoms as $R^3$ include a methyl group, an ethyl group, an n-propyl group, an isopropyl group, an n-butyl group, an s-butyl group, an isobutyl group, and a t-butyl group. The plural $R^3$ may be all the same or different from each other. Furthermore, in the above formulae (a-4) to (a-6), * is bound to a Si atom.

The T sites represented by the formula (a-4) and the formula (a-5) contain a group ($R^3$—O) capable of contributing to a polycondensation reaction. Accordingly, a polysilsesquioxane compound containing the T site in large amounts is excellent in reactivity. Moreover, a die bonding material containing such a polysilsesquioxane compound is excellent in curability.

In contrast, the T sites represented by the formula (a-5) and the formula (a-6) are bound to two or more silicon atoms (adjacent T site). Thus, a polysilsesquioxane compound containing the T sites in large amounts tends to have a higher molecular weight.

Hence, a polysilsesquioxane compound containing the T sites represented by the formula (a-5) in large amounts has a comparatively higher molecular weight and has sufficient reactivity.

As described below, the curable polysilsesquioxane compound (A) to be used in the present invention has the above-mentioned characteristics.

First, the curable polysilsesquioxane compound (A) satisfies the following requirement 1.

[Requirement 1]

As a result of measuring the $^{29}$Si-NMR of the curable polysilsesquioxane compound (A), one or two or more peaks are observed in a region [region (2)] of −62 ppm or more and less than −52 ppm, one or two or more peaks are observed in at least one region of a region [region (1)] of −52 ppm or more and less than −45 ppm and a region [region (3)] of −73 ppm or more and less than −62 ppm, and Z2 determined by the following formula is 20% to 40%.

Note that "a peak observed in the region (1)" means that a peak top is within the region (1). The same applies to "a peak observed in the region (2)" and "a peak observed in the region (3)".

$$Z2 = \frac{P2}{P1 + P2 + P3} \times 100$$

P1: an integrated value in the region (1)
P2: an integrated value in the region (2)
P3: an integrated value in the region (3)

In the specification, the "integrated value in the region (1)", the "integrated value in the region (2)", and the "integrated value in the region (3)" are values obtained by calculation using a range of −52 ppm to −45 ppm, a range of −62 ppm to −52 ppm, and a range of −73 ppm to −62 ppm as integration ranges, respectively.

Peaks observed in the region (1), the region (2), and the region (3) are attributed to silicon atoms in the T sites represented by the formula (a-4), the formula (a-5), and the formula (a-6), respectively.

Hence, the curable polysilsesquioxane compound satisfying the requirement 1 contains 20% to 40% of the T site represented by the formula (a-5), based on all the T sites.

As described above, the curable polysilsesquioxane compound has a comparatively higher molecular weight and has sufficient reactivity, and is therefore useful as a curable component of the die bonding material.

In the requirement 1, a value of Z2 is preferably 24% to 36%, and more preferably 27% to 32%. When Z2 is too small, the curable polysilsesquioxane compound (A) has insufficient reactivity. In contrast, when Z2 is too large, the storage stability of the die bonding material is low.

As a result of measuring the $^{29}$Si-NMR of the curable polysilsesquioxane compound (A), one or two or more peaks are preferably observed in the region (3), and Z3 determined by the following formula is preferably 60% to 80%.

$$Z3 = \frac{P3}{P1 + P2 + P3} \times 100$$

The curable polysilsesquioxane compound (A) having a Z3 value of 60% to 80% contains 60% to 80% of the T site represented by the formula (a-6), based on all the T sites.

The curable polysilsesquioxane compound (A) having a value of Z3 of 60% to 80% is more excellent in the balance between molecular weight and reactivity.

To achieve this effect more easily, the value of Z3 is preferably 64% to 76%, and more preferably 68% to 73%.

The values of Z2 and Z3 can be obtained, for example, by measuring $^{29}$Si-NMR under conditions described in Examples to obtain P1 to P3, and making a calculation in accordance with the above-mentioned formulae.

The curable polysilsesquioxane compound (A) satisfies the above-described requirement 2.

In other words, the mass average molecular weight (Mw) of the curable polysilsesquioxane compound (A) is 4,000 to 11,000, preferably 4,000 to 8,000, and more preferably 6,000 to 7,000.

As described above, the curable polysilsesquioxane compound satisfying the requirement 1 tends to have a comparatively higher molecular weight. The requirement 2 clarifies a range of the molecular weight.

When the curable polysilsesquioxane compound (A) having a mass average molecular weight (Mw) within the above-mentioned range is used as a curable component, a die bonding material that offers a cured product having higher adhesive strength and being more excellent in heat resistance can be obtained.

The molecular weight distribution (Mw/Mn) of the curable polysilsesquioxane compound (A) is not particularly limited, but is in a range of normally 1.0 to 10.0, and preferably 1.1 to 6.0. When the curable polysilsesquioxane compound (A) having a molecular weight distribution (Mw/Mn) within the above-mentioned range is used as a curable component, a die bonding material that offers a cured product more excellent in adhesiveness and heat resistance can be obtained.

The mass average molecular weight (Mw) and the number average molecular weight (Mn) can be determined as, for example, standard polystyrene-equivalent values by gel permeation chromatography (GPC) using tetrahydrofuran (THF) as a solvent.

The curable polysilsesquioxane compound (A) can be produced, for example, by polycondensing a compound represented by the following formula (a-7) (hereinafter, referred to as "the silane compound (1)" in some cases), or the silane compound (1) and a compound represented by the following formula (a-8) (hereinafter, referred to as "the silane compound (2)" in some cases) in the presence of a polycondensation catalyst.

$$R^1\text{-D-Si}(OR^4)_p(X^1)_{3-p} \quad (a\text{-}7)$$

$$R^2\text{Si}(OR^5)_q(X^2)_{3-q} \quad (a\text{-}8)$$

In formulas (a-7) and (a-8), $R^1$, $R^2$, and D represent the same groups as described above. Each of $R^4$ and $R^5$ independently represents an alkyl group having 1 to 10 carbon atoms, each of $X^1$ and $X^2$ independently represents a halogen atom, each of p and q independently represents an integer of 0 to 3. The plural $R^4$, $R^5$, $X^1$, and $X^2$ may be the same or different from each other.

Examples of the alkyl groups having 1 to 10 carbon atoms represented by $R^4$ and $R^5$ include the same as shown for the alkyl group having 1 to 10 carbon atoms represented by $R^2$.

Examples of the halogen atoms represented by $X^1$ and $X^2$ include a chlorine atom, and a bromine atom.

Examples of the silane compound (1) include: fluoroalkyltrialkoxysilane compounds such as $CF_3Si(OCH_3)_3$, $CF_3CF_2Si(OCH_3)_3$, $CF_3CF_2CF_2Si(OCH_3)_3$, $CF_3CF_2CF_2CF_2Si(OCH_3)_3$, $CF_3CH_2CH_2Si(OCH_3)_3$, $CF_3CF_2CF_2CF_2CH_2CH_2Si(OCH_3)_3$, $CF_3CF_2CF_2CF_2CF_2CF_2CH_2CH_2Si(OCH_3)_3$, $CF_3CF_2CF_2CF_2CF_2CF_2CF_2CF_2CH_2CH_2Si(OCH_3)_3$, $CF_3(C_6H_4)Si(OCH_3)_3$ (4-(trifluoromethyl)phenyltrimethoxysilane), $CF_3Si(OCH_2CH_3)_3$, $CF_3CF_2Si(OCH_2CH_3)_3$, $CF_3CF_2CF_2Si(OCH_2CH_3)_3$, $CF_3CF_2CF_2CF_2Si(OCH_2CH_3)_3$, $CF_3CH_2CH_2Si(OCH_2CH_3)_3$, $CF_3CF_2CF_2CF_2CH_2CH_2Si(OCH_2CH_3)_3$, $CF_3CF_2CF_2CF_2CF_2CF_2CH_2CH_2Si(OCH_2CH_3)_3$, $CF_3CF_2CF_2CF_2CF_2CF_2CF_2CF_2CH_2CH_2Si(OCH_2CH_3)_3$, and $CF_3(C_6H_4)Si(OCH_2CH_3)_3$ (4-(trifluoromethyl)phenyltriethoxysilane); fluoroalkyl halogenodialkoxysilane compounds such as $CF_3SiCl(OCH_3)_2$, $CF_3CF_2SiCl(OCH_3)_2$, $CF_3CF_2CF_2SiCl(OCH_3)_2$, $CF_3SiBr(OCH_3)_2$, $CF_3CF_2SiBr(OCH_3)_2$, $CF_3CF_2CF_2SiBr(OCH_3)_2$, $CF_3CF_2CF_2CF_2SiCl(OCH_3)_2$, $CF_3CH_2CH_2SiCl(OCH_3)_2$, $CF_3CF_2CF_2CF_2CH_2CH_2SiCl(OCH_3)_2$, $CF_3CF_2CF_2CF_2CF_2CF_2CH_2CH_2SiCl(OCH_3)_2$, $CF_3CF_2CF_2CF_2CF_2CF_2CF_2CF_2CH_2CH_2SiCl(OCH_3)_2$, $CF_3(C_6H_4)SiCl(OCH_3)_2$ (4-(trifluoromethyl)phenylchlorodimethoxysilane), $CF_3SiCl(OCH_2CH_3)_2$, $CF_3CF_2SiCl(OCH_2CH_3)_2$, $CF_3CF_2CF_2SiCl(OCH_2CH_3)_2$, $CF_3CH_2CH_2SiCl(OCH_2CH_3)_2$, $CF_3CF_2CF_2CF_2CH_2CH_2SiCl(OCH_2CH_3)_2$, $CF_3CF_2CF_2CF_2CF_2CF_2CH_2CH_2SiCl(OCH_2CH_3)_2$, $CF_3CF_2CF_2CF_2CF_2CF_2CF_2CF_2CH_2CH_2SiCl(OCH_2CH_3)_2$, and $CF_3(C_6H_4)SiCl(OCH_2CH_3)_2$ (4-(trifluoromethyl)phenylchlorodiethoxysilane); fluoroalkyl dihalogenoalkoxysilane compounds such as $CF_3SiCl_2(OCH_3)$, $CF_3CF_2SiCl_2(OCH_3)$, $CF_3CF_2CF_2SiCl_2(OCH_3)$, $CF_3CF_2CF_2CF_2SiCl_2(OCH_3)$, $CF_3CH_2CH_2SiCl_2(OCH_3)$, $CF_3CF_2CF_2CF_2CH_2CH_2SiCl_2(OCH_3)$, $CF_3CF_2CF_2CF_2CF_2CF_2CH_2CH_2SiCl_2(OCH_3)$, $CF_3CF_2CF_2CF_2CF_2CF_2CF_2CF_2CH_2CH_2SiCl_2(OCH_3)$, $CF_3(C_6H_4)SiCl_2(OCH_3)$ (4-(trifluoromethyl)phenyldichloromethoxysilane), $CF_3SiCl_2(OCH_2CH_3)$, $CF_3CF_2SiCl_2(OCH_2CH_3)$, $CF_3CF_2CF_2SiCl_2(OCH_2CH_3)$, $CF_3CH_2CH_2SiCl_2(OCH_2CH_3)$, $CF_3CF_2CF_2CF_2CH_2CH_2SiCl_2(OCH_2CH_3)$, $CF_3CF_2CF_2CF_2CF_2CF_2CH_2CH_2SiCl_2(OCH_2CH_3)$, $CF_3CF_2CF_2CF_2CF_2CF_2CF_2CF_2CH_2CH_2SiCl_2(OCH_2CH_3)$, and $CF_3(C_6H_4)SiCl_2(OCH_2CH_3)$ (4-(trifluoromethyl)phenyldichloroethoxysilane); and fluoroalkyltrihalogenosilane compounds such as $CF_3SiCl_3$, $CF_3CF_2SiCl_3$, $CF_3SiBr_3$, $CF_3CF_2SiBr_3$, $CF_3CF_2CF_2SiCl_3$, $CF_3CF_2CF_2CF_2SiCl_3$, $CF_3CH_2CH_2SiCl_3$, $CF_3CF_2CF_2CF_2CH_2CH_2SiCl_3$, $CF_3CF_2CF_2CF_2CF_2CF_2CH_2CH_2SiCl_3$, $CF_3CF_2CF_2CF_2CF_2CF_2CF_2CF_2CH_2CH_2SiCl_3$, and $CF_3(C_6H_4)SiCl_3$ (4-trifluoromethylphenyltrichlorosilane).

The silane compound (1) may be used either alone or in combination of two or more kinds.

Above all, the fluoroalkyltrialkoxysilane compounds are preferred as the silane compound (1).

Examples of the silane compound (2) include alkyltrialkoxysilane compounds such as methyltrimethoxysilane, methyltriethoxysilane, ethyltrimethoxysilane, ethyltriethoxysilane, ethyltripropoxysilane, n-propyltrimethoxysilane, n-propyltriethoxysilane, n-propyltripropoxysilane, n-propyltributoxysilane, n-butyltrimethoxysilane, isobutyltrimethoxysilane, n-pentyltrimethoxysilane, n-hexyltrimethoxysilane, and isooctyltriethoxysilane;

alkylhalogenoalkoxysilane compounds such as methylchlorodimethoxysilane, methylchlorodiethoxysilane, methyldichloromethoxysilane, methylbromodimethoxysilane, ethylchlorodimethoxysilane, ethylchlorodiethoxysilane, ethyldichloromethoxysilane, ethylbromodimethoxysilane, n-propylchlorodimethoxysilane, n-propyldichloromethoxysilane, n-butylchlorodimethoxysilane, and n-butyldichloromethoxysilane; and alkyltrihalogenosilane compounds, such as methyltrichlorosilane, methyltribromosilane, ethyltrichlorosilane, ethyltribromosilane, n-propyltrichlorosilane, n-propyltribromosilane, n-butyltrichlorosilane, isobutyltrichlorosilane, n-pentyltrichlorosilane, n-hexyltrichlorosilane, and isooctyltrichlorosilane.

The silane compound (2) may be used either alone or in combination of two or more kinds.

Above all, alkyltrialkoxysilane compounds are preferred as the silane compound (2).

The method for polycondensing the above-mentioned silane compounds are not particularly limited, and known methods can be used. However, in the production of the curable polysilsesquioxane compound (A), there are problem described below, and therefore, it is necessary to specially study reaction conditions.

One of the problems in the production of the curable polysilsesquioxane compound (A) is described in the above-mentioned Patent Literature 4. In other words, from Table 1 of the above-mentioned Patent Literature 4, it can be seen that, as the usage ratio of a silane compound having a fluoroalkyl group increases, an obtained polymer tends to have a lower molecular weight.

The reactivity of the silane compound (1) thus greatly differs from the reactivity of the silane compound (2), and therefore, it is difficult to obtain a curable polysilsesquioxane compound satisfying the requirement 1 and the requirement 2 by making use of conventional findings about a polycondensation reaction of the silane compound (2) just as they are.

In Examples of Patent Literature 4, a polycondensation reaction is actually performed using a silane compound having a fluoroalkyl group to produce a polymer. However, as described above, in the production method described in Patent Literature 4, the mixing ratio of the silane compound used for the reaction greatly influences the reaction, and accordingly, the molecular weight of the polymer cannot be controlled.

Furthermore, through the use of reaction conditions described in Examples of Patent Literature 4, a silane compound having poorer reactivity (a silane compound having a fluoroalkyl group) can be used as a monomer, but, even when this reaction condition is used, it is difficult to obtain the curable polysilsesquioxane compound satisfying the requirement 1 and the requirement 2.

As a result of a study about a polycondensation reaction using the silane compound (1), the inventors found that, when the polycondensation reaction is performed over many hours under comparatively moderate conditions, the curable polysilsesquioxane compound satisfying the requirement 1 and the requirement 2 can be obtained.

Specifically, a polycondensation reaction of a silane compound is performed at a predetermined temperature in a solvent or without a solvent by using a proper amount of an acid catalyst to obtain a reaction liquid containing a production intermediate, and subsequently, a base is added to neutralize the reaction liquid, and then the neutralized reaction liquid is subjected to a polycondensation reaction, whereby the curable polysilsesquioxane compound (A) can be produced.

Examples of the solvent include water; aromatic hydrocarbons, such as benzene, toluene, and xylene; esters, such as methyl acetate, ethyl acetate, propyl acetate, butyl acetate, and methyl propionate; ketones such as acetone, methylethylketone, methylisobutylketone, and cyclohexanone; and alcohols such as methyl alcohol, ethyl alcohol, n-propyl alcohol, isopropyl alcohol, n-butyl alcohol, isobutyl alcohol, s-butyl alcohol, and t-butyl alcohol. These solvents may be used either alone or in combination of two or more kinds.

In the case where a solvent is used, the amount of the solvent used is normally 0.001 to 10.000 liters, and preferably 0.010 to 0.9 liters, per 1 mol of the total molar amount of a silane compound.

Examples of the acid catalyst include inorganic acids such as phosphoric acid, hydrochloric acid, boric acid, sulfuric acid, and nitric acid; and organic acids such as citric acid, acetic acid, methanesulfonic acid, trifluoromethanesulfonic acid, benzenesulfonic acid, and p-toluenesulfonic acid. Above all, at least one selected from phosphoric acid, hydrochloric acid, boric acid, sulfuric acid, citric acid, acetic acid, and methanesulfonic acid is preferred.

The acid catalyst is normally used in an amount within a range of 0.01 to 2.00 mol %, preferably 0.05 to 1.00 mol %, and more preferably 0.10 to 0.30 mol % based on the total molar amount of the silane compound.

The reaction temperature of a reaction in the presence of the acid catalyst is normally 20° C. to 90° C., and preferably 25° C. to 80° C.

The reaction time of the reaction in the presence of the acid catalyst is normally 1 to 48 hours, and preferably 3 to 24 hours.

The mass average molecular weight (Mw) of a production intermediate obtained by the reaction in the presence of the acid catalyst is normally 800 to 5,000, and preferably 1,200 to 4,000.

Examples of the base used for the neutralization of the reaction liquid include ammonia water; organic bases, such as trimethylamine, triethylamine, pyridine, 1,8-diazabicyclo[5.4.0]-7-undecene, aniline, picoline, 1,4-diazabicyclo[2.2.2]octane, and imidazole; organic hydroxides, such as tetramethylammonium hydroxide and tetraethylammonium hydroxide; metal alkoxides, such as sodium methoxide, sodium ethoxide, sodium t-butoxide, and potassium t-butoxide; metal hydrides, such as sodium hydride and calcium hydride; metal hydroxides, such as sodium hydroxide, potassium hydroxide, and calcium hydroxide; metal carbonates, such as sodium carbonate, potassium carbonate, and magnesium carbonate; and metal hydrogencarbonates, such as sodium hydrogencarbonate and potassium hydrogencarbonate.

The amount of the base used for the neutralization of the reaction liquid is in a range of normally 0.01 to 2.00 mol %, preferably 0.05 to 1.00 mol %, and more preferably 0.10 to 0.70 mol %, based on the total molar amount of a silane compound.

Furthermore, the amount (mol) of the base used for the neutralization of the reaction liquid is preferably 0.5 to 5.0 times, more preferably 0.8 to 3.0 times, and still more preferably 1.0 to 2.0 times the amount (mol) of the acid catalyst used in the immediately preceding step.

The pH of the reaction liquid after the neutralization is normally 6.0 to 8.0, preferably 6.2 to 7.0, and more preferably 6.4 to 6.9.

The reaction temperature of the reaction following the neutralization is normally 40° C. to 90° C., and preferably 50° C. to 80° C.

The reaction time of the reaction following the neutralization is normally 20 to 200 minutes, and preferably 30 to 150 minutes.

In the above-described production method, the reaction in the presence of the acid catalyst is mainly aimed at hydrolysis, and the reaction following the neutralization is mainly aimed at dehydration condensation.

When the polycondensation reaction of the silane compound is thus performed, the curable polysilsesquioxane compound (A) can be efficiently produced.

After the completion of the reaction, known purification treatment is performed so that the curable polysilsesquioxane compound (A) can be isolated.

In the die bonding material of the present invention, the curable polysilsesquioxane compound (A) may be used either alone or in combination of two or more kinds.

The content of the curable polysilsesquioxane compound (A) in the die bonding material of the present invention is normally 40% to 80% by mass, and preferably 50% to 70% by mass, based on the total amount of solids in the die bonding material.

In the present invention, "solids" mean components other than a solvent in the die bonding material.

[Solvent]

The solvent constituting the die bonding material of the present invention is not particularly limited as long as the solvent is capable of dissolving or dispersing components of the die bonding material of the present invention.

As the solvent, a solvent having a boiling point of 254° C. or higher (hereinafter, referred to as "the solvent (S1)" in some cases) is preferred.

The boiling point of the solvent (S1) is 254° C. or higher, and preferably 254° C. to 300° C.

Here, the boiling point means a boiling point at 1,013 hPa (in the specification, the same is applied).

The solvent (S1) is not particularly limited, and any solvent having a boiling point of 254° C. or higher and capable of dissolving the curable polysilsesquioxane compound (A) may be used as the solvent (S1).

The solvent (S1) has a comparatively slow volatilization rate. Accordingly, even when the die bonding material containing the solvent (S1) is left to stand for many hours after applied, a change in the viscosity of the die bonding material is small, and therefore an optical element or the like can be mounted satisfactorily, as is the case at the time immediately after the application of the die bonding material.

Specific examples of the solvent (S1) include tripropylene glycol-n-butyl ether (boiling point: 274° C.), 1,6-hexanediol diacrylate (boiling point: 260° C.), diethylene glycol dibutyl ether (boiling point: 256° C.), triethylene glycol butylmethyl ether (boiling point: 261° C.), polyethylene glycol dimethyl ether (boiling point: 264° C. to 294° C.), tetraethylene glycol dimethyl ether (boiling point: 275° C.), and polyethylene glycol monomethyl ether (boiling point: 290° C. to 310° C.).

Above all, tripropyleneglycol-n-butylether and 1,6-hexanediol diacrylate are preferred as the solvent (S1), from the viewpoint of more easily achieving effects of the present invention.

The solvent (S1) may be used either alone or in combination of two or more kinds.

The die bonding material of the present invention may contain a solvent other than the solvent (S1).

As the solvent other than the solvent (S1), a solvent having a boiling point of 200° C. or higher and lower than 254° C. (hereinafter, referred to as "the solvent (S2)" in some cases) is preferred.

The solvent (S2) is not particularly limited, and any solvent having a boiling point of 200° C. or higher and lower than 254° C. and capable of dissolving the curable polysilsesquioxane compound (A) may be used as the solvent (S2).

When the solvent (S1) and the solvent (S2) are used in combination, the curability of the die bonding material is enhanced.

Specific examples of the solvent (S2) include diethyleneglycol monobutylether acetate (boiling point: 247° C.), dipropylene glycol-n-butyl ether (boiling point: 229° C.), benzyl alcohol (boiling point: 204.9° C.), dipropylene glycol methyl ether acetate (boiling point: 209° C.), diethylene glycol butyl methyl ether (boiling point: 212° C.), dipropylene glycol-n-propyl ether (boiling point: 212° C.), tripropylene glycol dimethyl ether (boiling point: 215° C.), triethylene glycol dimethyl ether (boiling point: 216° C.), diethylene glycol monoethyl ether acetate (boiling point: 217.4° C.), diethylene glycol-n-butyl ether (boiling point: 230° C.), ethylene glycol monophenyl ether (boiling point: 245° C.), tripropylene glycol methyl ether (boiling point: 242° C.), propylene glycol phenyl ether (boiling point: 243° C.), and triethylene glycol monomethyl ether (boiling point: 249° C.).

Above all, preferably glycol-based solvents, more preferably diethylene glycol monobutyl ether acetate and dipropylene glycol-n-butyl ether, and still more preferably diethylene glycol monobutyl ether acetate are used as the solvent (S2), from the viewpoint of easily achieving the effects.

In the case where the solvent (S1) and the solvent (S2) are used in combination, specifically, a combination of tripropylene glycol-n-butyl ether (solvent (S1)) and diethylene glycol monobutyl ether acetate (solvent (S2)), a combination of 1,6-hexanediol diacrylate (solvent (S1)) and diethylene glycol monobutyl ether acetate (solvent (S2)), a combination of tripropylene glycol-n-butyl ether (solvent (S1)) and dipropylene glycol-n-butyl ether (solvent (S2)), and a combination of 1,6-hexanediol diacrylate (solvent (S1)) and dipropylene glycol-n-butyl ether (solvent (S2)) are preferred.

The die bonding material of the present invention contains a solvent in an amount so as to achieve a solid content of preferably 50% to 95% by mass, and more preferably of 60% to 85% by mass. When the solid content is within the above-mentioned range, a die bonding material excellent in workability in an application process can be more easily obtained.

In the case where the die bonding material of the present invention contains the solvent (S1) and/or the solvent (S2), the total amount of the solvent (S1) and the solvent (S2) is normally 50% to 100% by mass, preferably 70% to 100% by mass, and more preferably 90% to 100% by mass, based on the total amount of the solvents.

In the case where the die bonding material of the present invention contains the solvent (S1), the content of the solvent (S1) is normally 20% to 100% by mass, preferably 30% to 85% by mass, and more preferably 50% to 80% by mass, with respect to the total amount of the solvent (S1) and the solvent (S2).

The die bonding material satisfying the above-mentioned requirements related to the amount of solvents has an appropriate balance between adhesiveness and wettability (the later-described characteristics related to the spread of droplets).

The die bonding material of the present invention may contain a silane coupling agent having a nitrogen atom in its molecule (hereinafter, referred to as "the silane coupling agent (B)" in some cases) as a component (B).

The die bonding material containing the silane coupling agent (B) is excellent in workability in an application process and offers a cured product more excellent in adhesiveness, peeling resistance, and heat resistance.

Here, being excellent in workability in an application process means that, in the application process, when the die bonding material is discharged from a discharge pipe and subsequently the discharge pipe is pulled up, the die bonding material strings to only a small extent, or that the string of the die bonding material immediately breaks. The use of the die bonding material having such characteristics can prevent contamination of the surroundings due to resin splash or the spread of droplets.

The silane coupling agent (B) is not particularly limited, and any silane coupling agent having a nitrogen atom in its molecule may be used as the silane coupling agent (B). Examples of the silane coupling agent (B) include a trialkoxysilane compound represented by the following formula (b-1), and a dialkoxyalkylsilane compound an a dialkoxyarylsilane compound represented by the following formula (b-2).

In the above formula, $R^a$ represents an alkoxy group having 1 to 6 carbon atoms, such as a methoxy group, an ethoxy group, an n-propoxy group, an isopropoxy group, an n-butoxy group, or a t-butoxy group. The plural $R^a$ groups may be the same or different from each other.

$R^b$ represents an alkyl group having 1 to 6 carbon atoms, such as a methyl group, an ethyl group, an n-propyl group, an isopropyl group, an n-butyl group, or a t-butyl group; or an aryl group with or without a substituent, such as a phenyl group, a 4-chlorophenyl group, a 4-methylphenyl group, or a 1-naphthyl group.

$R^c$ represents an organic group having a nitrogen atom and having 1 to 10 carbon atoms. Furthermore, $R^c$ may bind to another group containing a silicon atom.

Specific examples of the organic group having 1 to 10 carbon atoms as $R^c$ include an N-2-(aminoethyl)-3-aminopropyl group, a 3-aminopropyl group, an N-(1,3-dimethylbutylidene) aminopropyl group, a 3-ureidopropyl group, and an N-phenyl-aminopropyl group.

Among the compounds represented by the formula (b-1) or (b-2), examples of compounds in the case where $R^C$ is an organic group bound to another group containing a silicon atom include an isocyanurate-based silane coupling agent containing an isocyanurate skeleton, and a urea-based silane coupling agent containing a urea skeleton.

To easily obtain a cured product having higher adhesive strength, above all, the isocyanurate-based silane coupling agent and the urea-based silane coupling agent are preferred, and a compound having 4 or more alkoxy groups bound to a silicon atom in its molecule is more preferred as the silane coupling agent (B).

Having 4 or more alkoxy groups bound to a silicon atom means that the total number of alkoxy groups bound to the same silicon atom and alkoxy groups bound to a different silicon atom is 4 or more.

Examples of the isocyanurate-based silane coupling agent having 4 or more alkoxy groups bound to a silicon atom include a compound represented by the following formula (b-3). Examples of the urea-based silane coupling agent having 4 or more alkoxy groups bound to a silicon atom include a compound represented by the following formula (b-4).

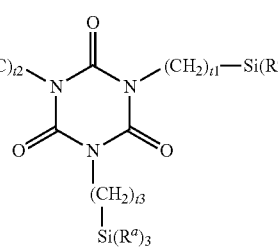

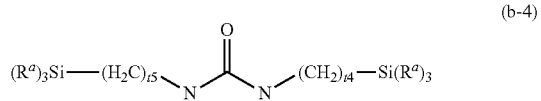

In the formula, $R^a$ represents the same as described above. t1 to t5 independently represent an integer of 1 to 10, preferably 1 to 6, and particularly preferably 3.

Specific examples of the compound represented by the formula (b-3) include 1,3,5-N-tris[(tri(1-6C)alkoxy)silyl (1-10C)alkyl] isocyanurate, such as 1,3,5-N-tris(3-trimethoxysilylpropyl) isocyanurate, 1,3,5-N-tris(3-triethoxysilylpropyl) isocyanurate, 1,3,5-N-tris(3-tri-i-propoxysilylpropyl) isocyanurate, and 1,3,5-N-tris(3-tributoxysilylpropyl) isocyanurate; and 1,3,5-N-tris[(di(1-6C)alkoxy)silyl (1-10C)alkyl] isocyanurate, such as 1,3,5-N-tris(3-dimethoxymethylsilylpropyl) isocyanurate, 1,3,5-N-tris(3-dimethoxyethylsilylpropyl) isocyanurate, 1,3,5-N-tris(3-dimethoxy-i-propylsilylpropyl) isocyanurate, 1,3,5-N-tris(3-dimethoxy-n-propylsilylpropyl) isocyanurate, 1,3,5-N-tris(3-dimethoxyphenylsilylpropyl) isocyanurate, 1,3,5-N-tris(3-diethoxymethylsilylpropyl) isocyanurate, 1,3,5-N-tris(3-diethoxyethylsilylpropyl) isocyanurate, 1,3,5-N-tris(3-diethoxy-i-propylsilylpropyl) isocyanurate, 1,3,5-N-tris(3-diethoxy-n-propylsilylpropyl) isocyanurate, 1,3,5-N-tris(3-diethoxyphenylsilylpropyl) isocyanurate, 1,3,5-N-tris(3-di-i-propoxymethylsilylpropyl) isocyanurate, 1,3,5-N-tris(3-di-i-propoxyethylsilylpropyl) isocyanurate, 1,3,5-N-tris(3-di-i-propoxy-i-propylsilylpropyl) isocyanurate, 1,3,5-N-tris(3-di-i-propoxy-n-propylsilylpropyl) isocyanurate, 1,3,5-N-tris(3-di-i-propoxyphenylsilylpropyl) isocyanurate, 1,3,5-N-tris(3-dibutoxymethylsilylpropyl) isocyanurate, 1,3,5-N-tris(3-dibutoxyethylsilylpropyl) isocyanurate, 1,3,5-N-tris(3-dibutoxy-i-propylsilylpropyl) isocyanurate, 1,3,5-N-tris(3-dibutoxy-n-propylsilylpropyl) isocyanurate, and 1,3,5-N-tris(3-dibutoxyphenylsilylpropyl) isocyanurate.

Specific examples of the compound represented by the formula (b-4) include N,N'-bis[(tri(1-6C)alkoxysilyl) (1-10C)alkyl] urea, such as N,N'-bis(3-trimethoxysilylpropyl) urea, N,N'-bis(3-triethoxysilylpropyl) urea, N,N'-bis(3-tripropoxysilylpropyl) urea, N,N'-bis(3-tributoxysilylpropyl) urea, and N,N'-bis(2-trimethoxysilylethyl) urea; N,N'-bis[(di(1-6C)alkoxy (1-6C)alkylsilyl (1-10C)alkyl] urea, such as N,N'-bis(3-dimethoxymethylsilylpropyl) urea, N,N'-bis(3-dimethoxyethylsilylpropyl) urea, and N,N'-bis(3-diethoxymethylsilylpropyl) urea; and N,N'-bis[(di(1-6C) alkoxy (6-20C)arylsilyl (1-10C)alkyl] urea, such as N,N'-bis(3-dimethoxyphenylsilylpropyl) urea and $N,N^1$-bis(3-diethoxyphenylsilylpropyl) urea.

The silane coupling agent (B) may be used either alone or in combination of two or more kinds.

Above all, 1,3,5-N-tris(3-trimethoxysilylpropyl) isocyanurate and 1,3,5-N-tris(3-triethoxysilylpropyl) isocyanurate (hereinafter, referred to as "the isocyanurate compound"), N,N'-bis(3-trimethoxysilylpropyl) urea and N,N'-bis(3-triethoxysilylpropyl) urea (hereinafter, referred to as "the urea compound"), and a combination of the isocyanurate compound and the urea compound are preferably used as the silane coupling agent (B).

In the case where the isocyanurate compound and the urea compound are used in combination, the mass ratio of (the isocyanurate compound):(the urea compound) for use is preferably 100:1 to 100:200, and more preferably 100:10 to 100:110. When the isocyanurate compound and the urea compound are used in combination at the above-mentioned ratio, a die bonding material offering a cured product having higher adhesive strength and more excellent in heat resistance can be obtained.

In the case where the die bonding material of the present invention contains the silane coupling agent (B) [component (B)], the content of the component (B) is not particularly limited, but the mass ratio of the component (A) to the component (B) [the component (A): the component (B)] is preferably 100:0.1 to 100:90, more preferably 100:0.3 to 100:60, more preferably 100:1 to 100:50, still more preferably 100:3 to 100:40, and particularly preferably 100:5 to 100:30.

The cured product of the die bonding material containing the component (A) and the component (B) at the above-mentioned ratio has higher adhesive strength and is more excellent in heat resistance.

The die bonding material of the present invention may contain, as a component (C), a silane coupling agent having an acid anhydride structure in its molecule (hereinafter, referred to as "the silane coupling agent (C)" in some cases).

The die bonding material containing the component (C) offers a cured product excellent in workability in an application process and having higher adhesive strength and being more excellent in peeling resistance and heat resistance.

Examples of the silane coupling agent (C) include tri(1-6C)alkoxysilyl (2-8C)alkylsuccinic anhydride such as 2-(trimethoxysilyl)ethylsuccinic anhydride, 2-(triethoxysilyl)ethylsuccinic anhydride, 3-(trimethoxysilyl)propylsuccinic anhydride, and 3-(triethoxysilyl)propylsuccinic anhydride; di(1-6C)alkoxymethylsilyl (2-8C)alkylsuccinic anhydride such as 2-(dimethoxymethylsilyl)ethylsuccinic anhydride; (1-6C)alkoxydimethylsilyl (2-8C)alkylsuccinic anhydride such as 2-(methoxydimethylsilyl)ethylsuccinic anhydride;

trihalogenosilyl (2-8C)alkylsuccinic anhydride such as 2-(trichlorosilyl)ethylsuccinic anhydride and 2-(tribromosilyl)ethylsuccinic anhydride; dihalogenomethylsilyl (2-8C)alkylsuccinic anhydride such as 2-(dichloromethylsilyl)ethylsuccinic anhydride; and halogenodimethylsilyl (2-8C)alkylsuccinic anhydride such as 2-(chlorodimethylsilyl)ethylsuccinic anhydride.

The silane coupling agent (C) may be used either alone or in combination of two or more kinds.

Above all, as the silane coupling agent (C), tri(1-6C)alkoxysilyl (2-8C)alkylsuccinic anhydride is preferred, and 3-(trimethoxysilyl)propylsuccinic anhydride or 3-(triethoxysilyl)propylsuccinic anhydride is particularly preferred.

In the case where the die bonding material of the present invention contains the silane coupling agent (C) [the component (C)], the content of the component (C) is not particularly limited, but the mass ratio of the component (A) to the component (C) [the component (A): the component (C)] is preferably 100:0.1 to 100:30, more preferably 100:0.3 to 100:20, more preferably 100:0.5 to 100:15, and still more preferably 100:1 to 100:10.

A cured product of the die bonding material containing the component (C) at the above-mentioned ratio has higher adhesive strength.

The die bonding material of the present invention may contain fine particles having an average primary particle diameter of 5 to 40 nm (hereinafter, referred to as "fine particles (D)" in some cases) as a component (D).

The die bonding material containing the fine particles (D) is excellent in workability in an application process.

To more easily achieve the above-mentioned effect, the average primary particle diameter of the fine particles (D) is preferably 5 to 30 nm, and more preferably 5 to 20 nm.

The average primary particle diameter of the fine particles (D) can be determined by observing the shape of the fine particles with a transmission electron microscope.

The specific surface area of the fine particles (D) is preferably 10 to 500 m$^2$/g, and more preferably 20 to 300 m$^2$/g. When the specific surface area is within the above-mentioned range, a die bonding material excellent in workability in an application process can be easily obtained.

The specific surface area can be determined using a BET multipoint method.

The fine particles (D) may have any of a spherical shape, a chain shape, a needle shape, a plate shape, a flake shape, a stick shape, a fiber shape, and the like, but preferably have a spherical shape. Here, the spherical shape means not only a true spherical shape, but also an approximately spherical shape including polyhedral shapes that can bear similarity to a sphere, such as a spheroidal shape, an egg shape, a Kompeito (Japanese pointed sugar candy balls) shape, and a cocoon shape.

Constituent components of the fine particles (D) are not particularly limited, and examples thereof include metal; metal oxides; minerals; metal carbonates, such as calcium carbonate and magnesium carbonate; metal sulfates, such as calcium sulfate and barium sulfate; metal hydroxides, such as aluminum hydroxide; metal silicates, such as aluminum silicate, calcium silicate, and magnesium silicate; inorganic components, such as silicas; silicones; and organic components, such as acryl-based polymers.

The fine particles (D) to be used may have a modified surface.

The metals refer to elements belonging to Group 1 (excluding H), Groups 2 to 11, Group 12 (excluding Hg), Group 13 (excluding B), Group 14 (excluding C and Si), Group 15 (excluding N, P, As, and Sb), or Group 16 (excluding O, S, Se, Te, and Po) in the periodic table.

Examples of the metal oxides include titanium oxide, alumina, boehmite, chromium oxide, nickel oxide, copper oxide, titanium oxide, zirconium oxide, indium oxide, zinc oxide, and complex oxides thereof. Fine particles of the metal oxides also include sol particles of the above-mentioned metal oxides.

Examples of the mineral include smectite and bentonite.

Examples of the smectite include montmorillonite, beidellite, hectorite, saponite, stevensite, nontronite, and sauconite.

Examples of the silicas include dry silicas, wet silicas, and surface-modified silicas (silicas having a modified surface).

The fine particles (D) may be used either alone or in combination of two or more kinds.

To easily obtain a cured product excellent in transparency, above all, the silicas, the metal oxides, and the minerals are preferred, and the silicas are more preferred as the fine particles (D).

To obtain a die bonding material more excellent in workability in an application process, among the silicas, the surface-modified silicas are preferred, and hydrophobic surface-modified silicas are more preferred.

Examples of the hydrophobic surface-modified silicas include silicas whose surface is bound to: a trialkylsilyl group (in which an alkyl group has preferably 1 to 20 carbon atoms) such as a trimethylsilyl group; a dialkylsilyl group (in which an alkyl group has preferably 1 to 20 carbon atoms) such as a dimethylsilyl group; or a monoalkylsilyl group (in which an alkyl group has preferably 1 to 20 carbon atoms) such as an octylsilyl group, and silicas having a surface treated with a silicone oil.

The hydrophobic surface-modified silicas can be obtained, for example, by modifying surfaces of silica particles with a silane coupling agent having the above-mentioned trialkylsilyl group, the above-mentioned dialkylsilyl group, or the above-mentioned monoalkylsilyl group, or by treating silica particles with a silicone oil. Alternatively, a commercially available surface-modified silica may be used as it is.

In the case where the die bonding material of the present invention contains the fine particles (D) [the component (D)], the content of the component (D) is not particularly limited, but, the fine particles (D) contained is in such an amount that the mass ratio of the component (A) to the component (D) [the component (A): the component (D)] is preferably 100:0.1 to 100:90, more preferably 100:0.2 to 100:60, still more preferably 100:0.3 to 100:50, still more preferably 100:0.5 to 100:40, and still more preferably 100:0.8 to 100:30. When the component (D) is used in the above-mentioned range, effects owing to the addition of the component (D) can be made more apparent.

The die bonding material of the present invention may contain fine particles having an average primary particle diameter of larger than 0.04 μm and 8 μm or smaller (hereinafter, referred to as "fine particles (E)" in some cases) as a (E) component.

The use of the die bonding material containing the fine particles (E) allows the formation of a cure product excellent in peeling resistance.

To more easily achieve the above-mentioned effect, the fine particles (E) have an average primary particle diameter of preferably 0.06 to 7 μm, more preferably 0.3 to 6 μm, and still more preferably 0.5 to 4 μm.

The average primary particle diameter of the fine particles (E) can be determined by measuring a particle size distribution by laser scattering using a laser diffraction/scattering type particle size distribution measuring device (for example, product name "LA-920", manufactured by HORIBA, Ltd.) or the like.

The fine particles (E) may have any of a spherical shape, a chain shape, a needle shape, a plate shape, a flake shape, a stick shape, a fiber shape, and the like, but preferably have a spherical shape. Here, the spherical shape means not only a true spherical shape, but also an approximately spherical shape including polyhedral shapes that can bear similarity to a sphere, such as a spheroidal shape, an egg shape, a Kompeito (Japanese pointed-sugar-candy-balls) shape, and a cocoon shape.

Examples of constituent components of the fine particles (E) include constituent components similar to those having been exemplified as the constituent components of the fine particles (D).

To easily achieve the above-mentioned effects, above all, at least one kind of fine particles selected from the group consisting of metal oxides having a surface coated with silicone, silica, and silicone is preferred, and silica and silicone are more preferred as the fine particles (E).

In the case where the die bonding material of the present invention contains the fine particles (E) [the component (E)], the content of the component (E) is not particularly limited, but, the fine particles (E) is contained in such an amount that the mass ratio of the component (A) to the component (E) [the component (A): the component (E)] is preferably 100: 0.1 to 100:40, more preferably 100:0.2 to 100:30, still more preferably 100:0.3 to 100:20, still more preferably 100:0.5 to 100:15, and still more preferably 100:0.8 to 100:12. When the component (E) is used in the above-mentioned range, effects owing to the addition of the component (E) can be made more apparent.

The die bonding material of the present invention may further contain another component [the component (F)] other than the above-mentioned components (A) to (E) unless the object of the present invention is impaired.

Examples of [component (F)] include an antioxidant, a UV absorber, and a light stabilizer.

The antioxidant is added to prevent oxidative degradation during heating. Examples of the antioxidant include a phosphorus-based antioxidant, a phenol-based antioxidant, and a sulfur-based antioxidant.

Examples of the phosphorus-based antioxidant include phosphites, and oxaphosphaphenanthrene oxides. Examples of the phenol-based antioxidant include monophenols, bisphenols, and polymeric phenols. Examples of the sulfur-based antioxidant include dilauryl-3,3'-thiodipropionate, dimyristyl-3,3'-thiodipropionate, and distearyl-3,3'-thiodipropionate.

These antioxidants may be used either alone or in combination of two or more kinds. The antioxidant is normally used in an amount of 10 mass % or less based on the component (A).

The UV absorber is added for the purpose of improving a light resistance of the obtained cured product.

Examples of the UV absorber include salicylic acids, benzophenones, benzotriazoles, and hindered amines.

The UV absorber may be used either alone or in combination of two or more kinds.

The UV absorber is normally used in an amount of 10 mass % or less based on the component (A).

The light stabilizer is added for the purpose of improving the light resistance of the obtained cured product.

Examples of the light stabilizer include, for example, hindered amines such as pol [{6-(1,1,3,3-tetramethylbutyl)amino-1,3,5-triazin-2,4-diyl}{(2,2,6,6-tetramethyl-4-piperidine)imino}hexamethylene {(2,2,6,6-tetramethyl-4-piperidine)imino}].

These light stabilizers may be used either alone or in combination of two or more kinds.

The component (F) is normally used in a total amount of 20 mass % or less based on the component (A).

The die bonding material of the present invention can be prepared, for example, by mixing the above-mentioned component (A), a solvent, and optionally a component other than the component (A) and the solvent at a predetermined ratio, and defoaming the mixture.

The mixing method and the defoaming method are not particularly limited, and known methods can be used.

The die bonding material of the present invention contains the curable polysilsesquioxane compound (A). Thus, the die bonding material of the present invention is excellent in curability and has a low refractive index. Furthermore, the die bonding material of the present invention is useful as a material to form a cured product having high adhesive strength.

In the present invention, "a die bonding material excellent in curability" means "a die bonding material curable without excessive heating". Examples of a heating temperature for curing the die bonding material excellent in curability include "130° C. or higher and 140° C. or lower" as described later.

The refractive index (nD) at 25° C. of the die bonding material of the present invention is 1.410 to 1.430, and preferably 1.412 to 1.428.

The refractive index (nD) of the die bonding material can be measured by a method described in Examples.

The die bonding material of the present invention has a thixotropic index of 2 or more, and preferably 3 or more. The upper limit of the thixotropic index is not particularly limited, but normally 20 or less, preferably 15 or less, and more preferably 12 or less.

In the present invention, the thixotropic index means a value obtained by measuring viscosities at shear rates of 2 s$^{-1}$ and 200 s$^{-1}$ at 25° C. with a known rheometer using a cone plate having a cone radius of 50 mm and a cone angle of 0.5°, and dividing the viscosity measured at a shear rate of 2 s$^{-1}$ by the viscosity measured at a shear rate of 200 s$^{-1}$.

The die bonding material having a thixotropic index of 2 or more is excellent in thixotropic properties. The thixotropic properties mean that, when a force is applied to a material, the viscosity of the material decreases to easily cause deformation, and when the material is left to stand (stands still), the viscosity increases again.

The die bonding material having excellent thixotropic properties is excellent in workability in an application process.

In other words, when the die bonding material having excellent thixotropic properties is discharged from a discharge pipe and subsequently pulled up the discharge pipe, the die bonding material strings to only a small extent, or the string of the die bonding material immediately breaks. Hence, the use of the die bonding material having such properties can prevent contamination of the surroundings due to resin splash or the spread of droplets.

The die bonding material having excellent thixotropic properties can be obtained, for example, by blending any of the above-mentioned components (B) to (D).

Above all, the component (D) is preferably used because the component (D) greatly influences on thixotropic properties.

The die bonding material of the present invention preferably satisfies the following requirement 3.

[Requirement 3]

When the solid-state Si nuclear magnetic resonance spectrum of a cured product of the die bonding material is measured, a peak is observed in a region of −80 ppm or more and less than −40 ppm, and the half-width of the peak is 500 Hz or more and 900 Hz or less.

The half-width of a peak refers to a width obtained by cutting a peak shape at a value that is half of the value (height) of a peak in a solid-state Si nuclear magnetic resonance spectrum. For example, when a peak shape is cut at a value that is half of the value of a peak and the values of the resulting peaks are respectively taken as a (ppm) and b (ppm) (b>a), the half-width of the peak is determined by (b−a)×M (wherein the unit is Hz, and M represents a resonance frequency).

The half-width of the peak observed in a region of −80 ppm or more and less than −40 ppm is preferably 500 Hz or more and 900 Hz or less, more preferably 500 Hz or more and 800 Hz or less, still more preferably 500 Hz or more and 700 Hz or less, and particularly more preferably 500 Hz or more and 600 Hz or less.

When the half-width of the peak observed in a region of −80 ppm or more and less than −40 ppm is 500 Hz or more and 900 Hz or less, a die bonding material that offers a cured product having higher adhesive strength can be more easily obtained.

In the case where a plurality of peaks overlapping each other is observed in a region of −80 ppm or more and less than −40 ppm, the half-width of each of the peaks can be determined by performing a curve fitting analysis using a Gaussian function or a Lorentzian function.

Note that, in the case where, as a result of measuring the solid-state Si nuclear magnetic resonance spectrum of the cured product, a plurality of peaks is observed in a region of −80 ppm or more and less than −40 ppm, a die bonding material satisfying the above-described requirement 3 is such that the half-width of at least one of the peaks in the above-mentioned region is in the above-mentioned range.

The solid-state Si nuclear magnetic resonance spectrum may be measured at room temperature (for example, 25° C.) in accordance with a usual method.

The half width of a peak whose chemical shift is in a region of −80 ppm or more and less than −40 ppm is affected by the types of (R$^1$-D) and R$^2$ in a repeating unit and components other than the component (A).

Therefore, the die bonding material satisfying the above-mentioned requirement 3 can be efficiently obtained in such a manner that the curable polysilsesquioxane compound (A) is obtained, the solid-state Si nuclear magnetic resonance spectrum of a cured product is measured, the half width of a peak in the above-mentioned region is determined, and subsequently, for example, the amount of a component added other than the component (A) is appropriately determined in accordance with the resulting half width.

Note that the chemical shift and the half-width of a peak normally do not depend on curing conditions and the like as long as a cured product obtained by sufficiently curing the die bonding material is used as a measurement sample for measuring a solid-state Si nuclear magnetic resonance spectrum.

When the die bonding material of the present invention is subjected to a curing reaction, for example, at 170° C. for 2 hours, a cured product suitable as the measurement sample can be obtained.

Whether a curing product results from a sufficient curing reaction and is suitable as the measurement sample can be confirmed by observing that there is little significant weight loss due to an increase in temperature, by differential heat thermogravimetry (TG-DTA), for example.

The die bonding material of the present invention is suitably used for fixing a light emitting element at a predetermined position.

In other words, the use of the die bonding material of the present invention allows the light emitting element to be firmly fixed. Furthermore, the use of the die bonding material of the present invention allows a light-emitting device to be produced without contaminating the surroundings.

Furthermore, as described above, the use of the die bonding material of the present invention allows the effect of enhancing the optical extraction efficiency of the light-emitting device to be achieved.

Details about a method for fixing the light emitting element at the predetermined position by using the die bonding material of the present invention will be given in a description about the present invention of a method for producing the light-emitting device.

2) Light-Emitting Device

A light-emitting device of the present invention includes an element-housing and a light emitting element. The element-housing includes a pair of lead electrodes and a mold integrally formed with the pair of lead electrodes, and has a recess, in which the pair of lead electrodes constitutes the bottom of the recess. The light emitting element is fixed, with an adhesive member, onto at least one of the pair of lead electrodes constituting the bottom of the recess. The adhesive member is a cured product of the die bonding material of the present invention.

Hereinafter, embodiments of the present invention will be suitably described with reference to the drawings. Note that a light-emitting device described below is to specify technical ideas of the present invention, and the present invention is not limited to the following unless otherwise specified. Furthermore, a description given in one embodiment can be applied to other embodiments. Furthermore, the size, positional relationship, and the like of constituents illustrated in the drawings are sometimes exaggerated.

Hereinafter, it is defined that the visible wavelength region extends in a range of 380 nm or more and 780 nm or less; a blue wavelength region extends in a range of 420 nm or more and 480 nm or less; a green to yellow wavelength region extends in a range of 500 nm or more and 590 nm or less; and a red wavelength region extends in a range of 610 nm or more and 750 nm or less.

First Embodiment

Figure 2:
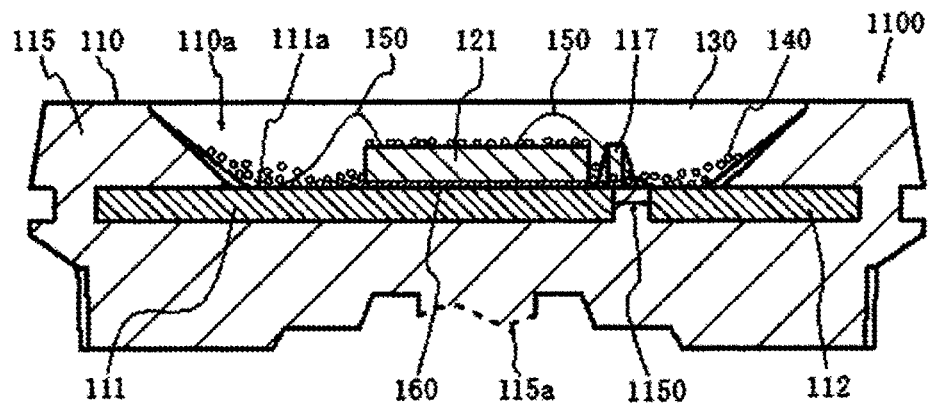
FIG. 2 is a schematic sectional view, taken along line A-A in FIG. 1, of the light-emitting device according to the embodiment of the present invention.
Figure 3:
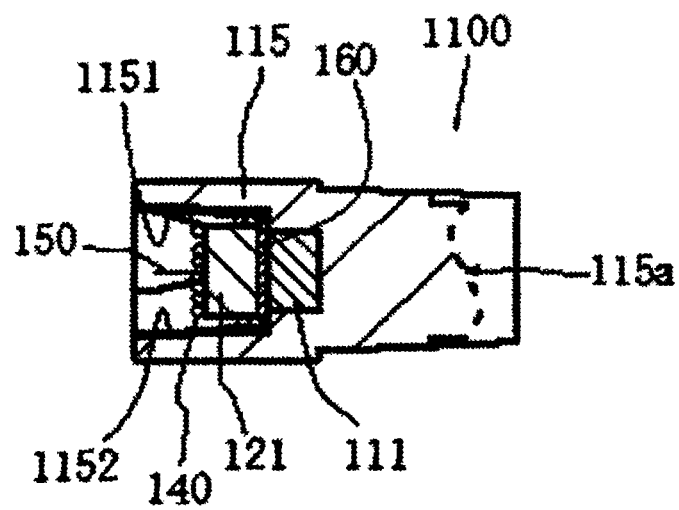
FIG. 3 is a schematic sectional view, taken along line B-B in FIG. 1, of the light-emitting device according to the embodiment of the present invention.
Figure 4:
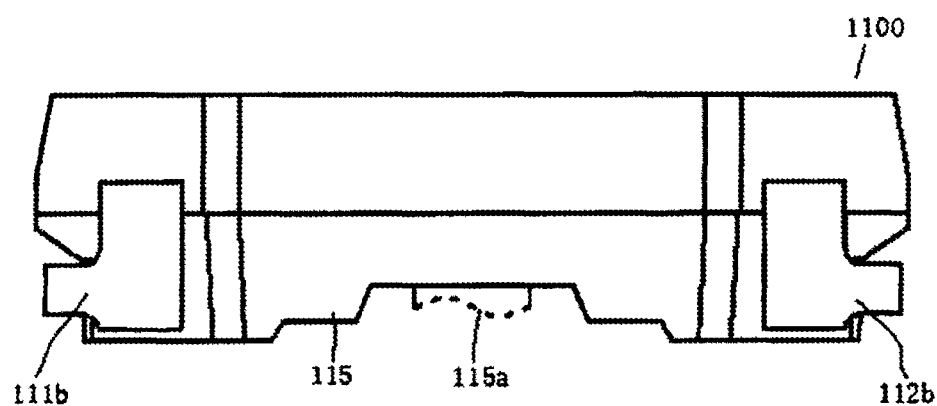
FIG. 4 is a schematic bottom view of the light-emitting device, illustrated in FIG. 1, according to the embodiment of the present invention.

FIG. 1 and FIG. 4 are a schematic elevation view (a schematic front view) and a schematic bottom view of a light-emitting device 1100 according to a first embodiment of the present invention, respectively. FIG. 2 is a schematic sectional view, taken along line A-A in FIG. 1. FIG. 3 is a schematic sectional view, taken along line B-B in FIG. 1.

The light-emitting device 1100 according to the first embodiment includes an element-housing 110 and a light emitting element 121. The light-emitting device 1100 and the element-housing 110 extend longer in a lateral direction (the right-left direction in the drawings). The element-housing 110 has a recess 110a. Similarly to the element-housing 110, the recess 110a extends longer in the lateral direction. The element-housing 110 includes a first lead electrode 111 and a second lead electrode 112 (a pair of lead electrodes 111 and 112), and a mold 115 integrally formed with the first lead electrode 111 and the second lead electrode 112. The first lead electrode 111 and the second lead electrode 112 stand in line along the lateral direction. The first lead electrode 111 and the second lead electrode 112 constitute the bottom of the recess 110a. The mold 115 constitutes a side wall of the recess 110a. The light emitting element 121 is accommodated in the recess 110a. The light emitting element 121 is electrically connected to the first lead electrode 111 and the second lead electrode 112. It is sufficient that the light emitting element 121 is disposed on at least one of the first lead electrode 111 and the second lead electrode 112 of the bottom of the recess 110a.

More specifically, the light-emitting device 1100 is a light-emitting diode (LED). The recess 110a is provided in one (the front face) of side faces of the element-housing 110. The mold 115 contains a white pigment and a filler, and in particular has light reflecting properties owing to the white pigment. Thus, a light-emitting region of the light-emitting device 1100 (light leakage is left out of consideration) is approximately in agreement with the opening of the recess 110a in the front face. The first lead electrode 111 and the second lead electrode 112 of the first embodiment are unsymmetrical, based on the center in the lateral direction of the light-emitting device 1100 (the element-housing 110). A surface of the mold 115 and surfaces of the first lead electrode 111 and the second lead electrode 112 constitute the bottom of the recess 110a. A portion of the first lead electrode 111 constituting the bottom of the recess 110a is a first element mounting section 111a including an adhesion region of the light emitting element 121 and/or a connection region of a wire 150. The light emitting element 121 is fixed (mounted) onto the first lead electrode 111 with an adhesive member 160. Furthermore, a portion of the second lead electrode 112 includes the connection region of the wire 150. Furthermore, the first lead electrode 111 and the second lead electrode 112 have a first external connection terminal 111b and a second external connection terminal 112b as parts outside the mold 115, respectively. The first external connection terminal 111b and the second external connection terminal 112b are bent along the lower surface of the mold 115. The light-emitting device 1100 is mounted by soldering the first external connection terminal 111b and the second external connection terminal 112b to a circuit board or the like. Hence, the mounting-side main surface of the light-emitting device 1100 (the element-housing 110) is a lower surface. More specifically, the left and right portions of the lower surface of the mold 115 have regions (left region and right region) in which the external connection terminal 111b and the second external connection terminal 112b are disposed, respectively. A portion from the central region to the left or right region of the lower surface of the mold 115 is stepped. Accordingly, the shape of the front face of the element-housing 110 (the mold 115) and the shape of the opening of the recess 110a are formed so that the central region is wider toward the lower side (in other words, wider in the longitudinal direction) than the left or right region.

The mold 115 has reinforcing sections 117 approximately symmetrical on two side walls 1151 and 1152 facing each other along the longitudinal direction of the recess 110a (the up-down direction in FIG. 1). The height of the two reinforcing sections 117 is lower than the height of the front face of the mold 115, and higher than the height of the upper face (the front face) of the light emitting element 121.

The reinforcing section 117 is capable of moderately reducing the blocking of light from the light emitting element 121 to be less likely to affect light distribution of the device, and capable of effectively enhancing the mechanical strength of the mold 115 to substantially prevent deformation. Thus, there can be obtained the element-housing 110 that is resistant to deformation caused by not only external force but also a temperature change, due to heating during reflow solder mounting and/or heat generation of the light emitting element 121 and a later-described wavelength conversion substance 140, for example, and can easily obtain desired light distribution.

Note that the reinforcing section 117 is present inside the recess 110a, and in particular in a region from the bottom of the recess 110a to the side walls 1151 and 1152. More specifically, the reinforcing section 117 is a projection higher than the surfaces of the first lead electrode 111 and the second lead electrode 112 of the bottom of the recess 110a. The two reinforcing sections 117 are projections projecting toward the inner side of the recess 110a, based on the surfaces of the side walls 1151 and 1152, respectively.

The reinforcing sections 117 are preferably disposed on a separator region 1150 configured to separate the first lead electrode 111 and the second lead electrode 112. The neighborhood of the separator region 1150 of the mold 115 is a part in which a damage such as a crack in the mold 115 is easily caused, and therefore, the neighborhood of the separator region 1150 of the mold 115 can be reinforced by the reinforcing sections 117. In this case, the reinforcing sections 117 are usually continuous to the separator region 1150 of the mold 115.

The light-emitting device 1100 is preferably a side-face light emission type (a side view type).

The light-emitting device 1100 includes a sealing member 130. The sealing member 130 is filled in the recess 110a. The sealing member 130 contains the wavelength conversion substance 140 configured to convert light emitted from the light emitting element 121 into light having a different wavelength. The wavelength conversion substance 140 contains a first phosphor that emits green light or yellow light, and a second phosphor that emits red light. In this case, it is sufficient that the light emitting element 121 is an element that emits blue light. This configuration allows light emission excellent in color reproduction or color rendering.

Furthermore, the second phosphor preferably contains a fluoride phosphor activated with manganese. The fluoride phosphor activated with manganese is capable of emitting light with a narrow spectrum half width in the red region.

A base material of the sealing member 130 is preferably a silicone-based resin having a phenyl group. The silicone-based resin is a thermosetting resin excellent in heat resistance and light resistance, and since the silicone-based resin has a phenyl group, the heat resistance is further enhanced. Among silicone-based resins, the silicone-based resin containing a phenyl group has comparatively higher gas barrier properties, and therefore, can easily reduce deterioration due to moisture of the fluoride phosphor activated with manganese. In addition, deterioration of the first lead electrode 111, the second lead electrode 112, and the later-mentioned wire 150 due to corrosive gas such as sulfur-containing gas tends to be reduced. Note that the fluoride phosphor activated with manganese is preferably present in larger amounts in the sealing member 130 on the rear side, that is, the bottom side of the recess 110a, than the front side, thereby, the fluoride phosphor activated with manganese is prevented from deteriorating due to moisture and heat.

The light-emitting device 1100 include the wire 150 configured to connect the first lead electrode 111 and the second lead electrode 112 to the light emitting element 121. The wire 150 is accommodated in the recess 110a and is sealed by the sealing member 130. From the viewpoint of enhancing light reflection properties, the wire 150 preferably contains silver. In other words, the wire 150 preferably has at least a surface formed of silver or silver alloy, and more preferably is a silver wire or a silver alloy wire. From the viewpoint of preventing breakage, the wire 150 containing silver is particularly preferably a gold wire a surface of which is coated with silver or a silver alloy, or a silver alloy wire containing gold. It is sufficient that the wire 150 connects at least one of the first lead electrode 111 and the second lead electrode 112 to the light emitting element 121.

Note that the mold 115 has a gate trace 115a in a rear formation part that covers rear faces of the first lead electrode 111 and the second lead electrode 112. In particular, the rear formation part of the mold 115 covers the whole of the rear surfaces of portions, inside the mold 115, of the first lead electrode 111 and the second lead electrode 112. Such mold 115 is mainly formed by injection molding. In the injection molding, a resin having a comparatively higher melt viscosity is forcibly poured into a cavity of a mold from a gate. Thus, with the pressure of the resin, the front faces of the first lead electrode 111 and the second lead electrode 112, in particular, the first element mounting section 111a is pressed against the mold to substantially prevent the formation of burrs on the first element mounting section 111a. Furthermore, thus, the mold 115 covers both the front and rear surfaces of the first lead electrode 111 and the second lead electrode 112, so that the first lead electrode 111 and the second lead electrode 112 can be firmly held by the mold 115. For example, thermoplastic resin and unsaturated polyester resin have comparatively lower adhesion to the first lead electrode 111 and the second lead electrode 112, and therefore, such configuration of the mold 115 is suitable. Note that "the gate trace" is a projection formed in the mold 115 as the trace of a gate serving as an inlet for the resin into the cavity of the mold. Moreover, the front formation part of the mold 115 mainly constitutes a side wall surrounding the recess 110a.

Second Embodiment

Figure 5:
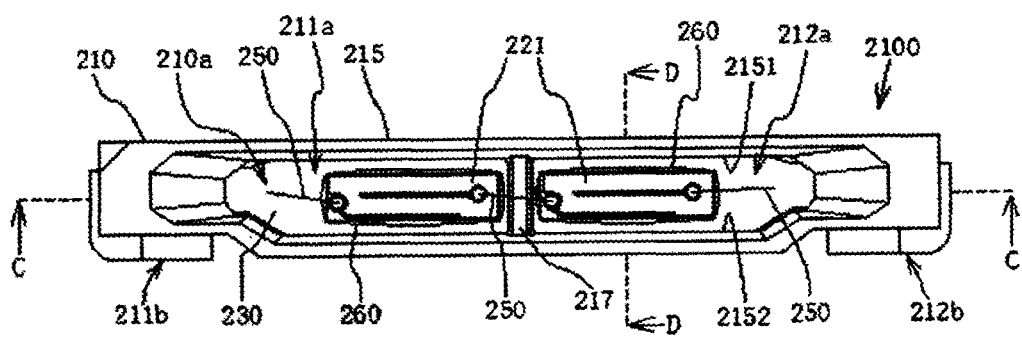
FIG. 5 is a schematic elevation view of a light-emitting device according to one embodiment of the present invention.
Figure 6:
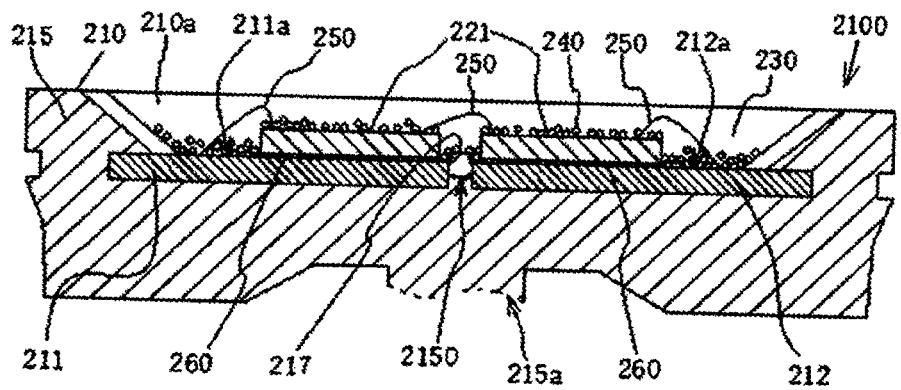
FIG. 6 is a schematic sectional view, taken along line C-C in FIG. 5, of the light-emitting device according to the embodiment of the present invention.
Figure 7:
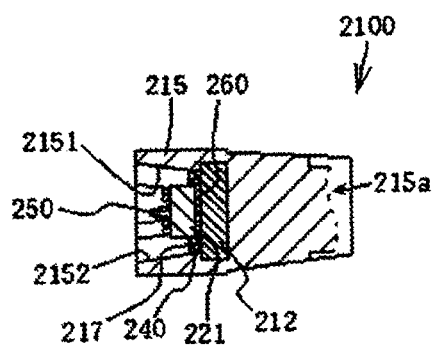
FIG. 7 is a schematic sectional view, taken along line D-D in FIG. 5, of the light-emitting device according to the embodiment of the present invention.
Figure 8:
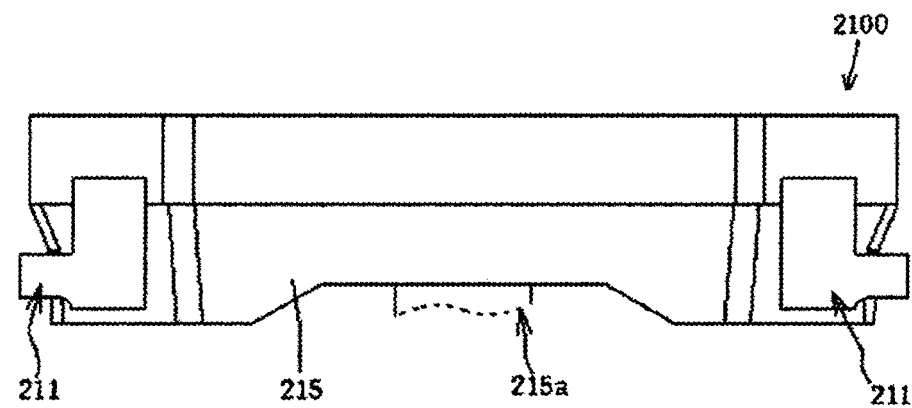
FIG. 8 is a schematic bottom view of the light-emitting device, illustrated in FIG. 5, according to the embodiment of the present invention.

FIG. 5 and FIG. 8 are a schematic elevation view (a schematic front view) and a schematic bottom view of a light-emitting device 2100 according to a second embodiment, respectively. FIG. 6 is a schematic sectional view, taken along line C-C in FIG. 5. FIG. 7 is a schematic sectional view, taken along line D-D in FIG. 5.

The light-emitting device 2100 according to the second embodiment 2 is substantially the same as the light-emitting device 1100 according to the first embodiment 1, except the shape of an element-housing 210, the shape of a first lead electrode 211 and a second lead electrode 212 (a pair of lead electrodes 211 and 212), the arrangement of two light emitting elements 221 (a first light emitting element 221 and a second light emitting element 221), and the shape of a reinforcing section 217. Therefore, hereinafter, descriptions will be given of only differences in the light-emitting device 2100 and the element-housing 210 from the light-emitting device 1100 and the element-housing 110, and descriptions about the other points will be omitted.

The light-emitting device 2100 according to the second embodiment includes the element-housing 210 and the two light emitting elements 221. The first lead electrode 211 and the second lead electrode 212 are symmetrical, based on the center in the lateral direction of the light-emitting device 2100 (the element-housing 210). A surface of the mold 215 and surfaces of the first lead electrode 211 and the second lead electrode 212 constitute the bottom of a recess 210a. Parts of the first lead electrode 211 and the second lead electrode 212 constituting the bottom of the recess 210a are a first element mounting section 211a and a second element mounting section 212a that include an adhesion region of the light emitting element 221 and a connection region of a wire 250, respectively. The two light emitting elements 221 are respectively fixed (mounted) on the first lead electrode 211 (first element mounting section 211a) and the second lead electrode 212 (second element mounting section 212a) of the bottom of the recess 210a with an adhesive member 260. The two light emitting elements 221 are electrically connected to the first lead electrode 211 and the second lead electrode 212, respectively.

The mold 215 has the reinforcing section 217 that connects two side walls 2151 and 2152 facing each other along the longitudinal direction of the recess 210a (the up-down direction in FIG. 5). The height of the reinforcing section 217 is higher than the height of the surfaces of the first lead electrode 211 and the second lead electrode 212 of the bottom of the recess 210a, and lower than the height of the upper face (the front face) of the light emitting element 221.

The reinforcing section 217 is disposed at the approximate center in the lateral direction of the recess 210a and on a separator region 2150 configured to separate the first lead electrode 211 and the second lead electrode 212, and is continuous to the separator region 2150. More specifically, the reinforcing section 217 is disposed between the two light emitting elements 221, and a part of the reinforcing section 217 covers peripheral portions of the first lead electrode 211 and the second lead electrode 212 of the bottom of the recess 210a. Thus, the first lead electrode 211 and the second lead electrode 212 can be firmly held by the mold 215.

Hereinafter, constituents of the light-emitting device according to one embodiment of the present invention will be described.

Light-Emitting Device 1100, 2100)

The light-emitting device is configured such that a light emitting element is accommodated in an element-housing and is electrically connected to a pair of lead electrodes, and is furthermore preferably sealed by a sealing member. The light-emitting device may be what is called a "light-emitting diode (LED)", for example.

(Element-Housing 110, 210)

The element-housing is a container configured to accommodate the light emitting element and having an electrode (terminal) for externally supplying electric power to the light emitting element. The element-housing includes at least the pair of lead electrodes, and a mold. The element-housing may be what is called a "package", for example.

(First Lead Electrode 111, 211, Second Lead Electrode 112, 212)

The pair of lead electrodes (a first lead electrode and a second lead electrode) constitutes a pair of positive and negative electrodes (terminals) in the element-housing. One element-housing includes at least one pair of lead electrodes, and may include a plurality of pairs thereof. The lead electrodes consist of those obtained by giving various processing such as pressing (including punching), etching, and rolling, to a plate made of zinc, iron, copper, lead, phosphorus, or an alloy of them. The lead electrodes may be configured with a laminate of these metals or alloys, but is preferably configured with a monolayer thereof because of its simplicity. A copper alloy containing copper as a main component (for example, phosphor bronze and iron-containing copper) is particularly preferred. Alternatively, surfaces of the lead electrodes may be provided with a light reflection film made of, for example, nickel, palladium, gold, silver, or an alloy thereof. Above all, silver or a silver alloy, which is excellent in light reflection properties, is preferred. In particular, a film made of silver or a silver alloy (for example, a plating film) including a sulfur-based brightener has a smooth surface, and has considerably high light reflection properties.

(Mold 115, 215)

The mold is a main body of the element-housing. The mold constitutes a part of the external form of the element-housing. From the viewpoint of light reflection properties, the mold achieves a light reflectance at a light emission peak wavelength of the light emitting element of preferably 75% or higher, and more preferably 90% or higher. Furthermore, the mold is preferably white. Before cured, the mold is in a fluid state, that is, a liquid state (including a sol state or a slurry state). The mold can be formed, for example, by injection molding or transfer molding.

(Base Material of Mold)

Thermosetting resin or thermoplastic resin can be used as a base material of the mold. Note that the following resin includes a modified resin thereof and a hybrid resin. Examples of the thermosetting resin include an unsaturated polyester resin. Furthermore, as the base material of the mold, thermoplastic resin is also preferred. This is because, compared with thermosetting resin, thermoplastic resin is normally more inexpensive, but is inferior in heat resistance and light resistance, and is easily deformed. Examples of the thermoplastic resin include 9C nylon resin and 9T nylon resin. From the viewpoints of light reflection properties, mechanical strength, and thermal elasticity, the mold preferably contains the following white pigment and filler in the base material, but is not limited to this.

(White Pigment)

Examples of the white pigment include titanium oxide. Titanium oxide is preferred because titanium oxide has a comparatively higher refractive index and is excellent in optical concealment. The shape of the white pigment is not particularly limited, and may be indefinite (granular), but, from the viewpoint of fluidity, is preferably spherical. The particle diameter (hereinafter, "the particle diameter" is defined as an average particle diameter D50) of the white pigment is not particularly limited, and is, for example, 0.01 µm or larger and 1 µm or smaller, and preferably 0.1 µm or larger and 0.5 µm or smaller. The content of the white pigment in the mold is not particularly limited, and is preferably larger, from the viewpoint of light reflection properties of the mold, but, when influence on flowability is taken into consideration, the content is preferably 20% by mass or more and 70% by mass or less, and more preferably 30% by mass or more and 60% by mass or less. Note that % by mass represents the ratio of the weight of a constituent material to the total weight of all constituent materials.

(Filler of Mold)

Examples of the filler include calcium silicate (wollastonite). Calcium silicate (wollastonite) is preferred as a reinforcing agent, and has a comparatively smaller diameter and therefore is suitable for a thin or small mold. Specifically, the average fiber diameter of the reinforcing agent is not particularly limited, and, for example, is 0.05 µm or more and 100 µm or less, preferably 0.1 µm or more and 50 µm or less, more preferably 1 µm or more and 30 µm or less, and still more preferably 2 µm or more and 15 µm or less. The average fiber length of the reinforcing agent is not particularly limited, and, for example, is 0.1 µm or more and 1 mm or less, preferably 1 µm or more and 200 µm or less, more preferably 3 µm or more and 100 µm or less, and still more preferably 5 µm or more and 50 µm or less. The average aspect ratio (average fiber length/average fiber diameter) of the reinforcing agent is not particularly limited, and, for example, is 2 or more and 300 or less, preferably 2 or more and 100 or less, more preferably 3 or more and 50 or less, and still more preferably 5 or more and 30 or less. The shape of the filler is not particularly limited, and may be indefinite (granular), but, from the functional viewpoint as the reinforcing agent, is preferably fibrous (needlelike) or tabular (scaly), and, from the viewpoint of fluidity, is preferably spherical. The content of the filler in the mold is not particularly limited, and is suitably determined in consideration of the thermal expansion coefficient and mechanical strength of the mold, but is preferably 10% by mass or more and 80% by mass or less, and more preferably 30% by mass or more and 60% by mass or less (in which the content of the reinforcing agent is preferably 5% by mass or more and 30% by mass or less, and 5% by mass or more and 20% by mass or lower).

(Light Emitting Element 121, 221)

As the light emitting element, a semiconductor light emitting element, such as an LED element, can be used. Although light emitting elements have a substrate in many cases, it is sufficient that the light emitting element at least includes an element structure including various types of semiconductors, and a pair of positive/negative (pn) electrodes. The light emitting element particularly preferably includes a nitride semiconductor ($In_xAl_yGa_{1-x-y}N$, $0 \leq x$, $0 \leq y$, $x+y \leq 1$) capable of emitting light in ultraviolet to visible regions. From the viewpoints of light emission efficiency, color mixture relationship with light from other light sources, the excitation efficiency of a wavelength conversion substance, and the like, the light emission peak wavelength of the light emitting element is preferably in a range of 445 nm or more and 465 nm or less. In the case of a light emitting element in which a pair of positive/negative electrodes is provided on the same side, each of the electrode is connected to a corresponding one of a pair of lead electrodes through a wire (face-up mounting). The number of the light emitting elements mounted in one element-housing may be one or two or more. The light emitting elements can be connected in series or in parallel through a wire.
(Sealing Member 130, 230)

The sealing member is a member that seals a light emitting element to give protection against dust, moisture, external force, and the like. It is sufficient that the sealing member has electric insulating properties and translucency to light emitted from the light emitting element (a light transmittance of preferably 70% or higher and more preferably 85% or higher in the light emission peak wavelength of the light emitting element). The sealing member preferably contains at least a wavelength conversion substance, but is not limited to this.
(Base Material of Sealing Member)

As the base material of the sealing member, a silicone-based resin having a phenyl group or a modified silicone resin may be used.
(Wavelength Conversion Substance 140, 240)

The wavelength conversion substance absorbs at least a part of primary light emitted from the light emitting element, and emits secondary light having a wavelength different from the wavelength of the primary light. Thus, a light-emitting device configured to emit mixed-color light (for example, white light) of the primary light and secondary light of visible wavelengths can be provided. The following specific examples of the wavelength conversion substance may be used either alone or in combination of two or more kinds.
(First Phosphor)

The first phosphor emits green light or yellow light. From the viewpoints of light emission efficiency, color mixture relationship with light from other light sources, and the like, the light emission peak wavelength of the first phosphor is preferably in the green range (500 nm or more and 560 nm or less), and more preferably in a range of 520 nm or more and 560 nm or less. Specific examples of the first phosphor include yttrium-aluminum-garnet-based phosphors (such as $Y_3(Al, Ga)_5O_{12}$: Ce), lutetium-aluminum-garnet-based phosphors (such as $Lu_3(Al, Ga)_5O_{12}$: Ce), silicate-based phosphors (such as $(Ba,Sr)_2SiO_4$: Eu), chlorosilicate-based phosphors (such as $Ca_8Mg(SiO_4)_4Cl_2$: Eu), and β-sialon-based phosphors (such as $Si_{6-z}Al_zO_zN_{8-z}$:Eu (0<Z<4.2)).
(Second Phosphor)

The second phosphor emits red light. From the viewpoints of light emission efficiency, color mixture relationship with light from other light sources, and the like, the light emission peak wavelength of the second phosphor is preferably in a range of 620 nm or more and 670 nm or less. Specific examples of the second phosphor include nitrogen-containing calcium aluminosilicate (CASN or SCASN)-based phosphors (such as (Sr,Ca)AlSiN$_3$: Eu). The fluoride phosphor activated with manganese is a phosphor represented by a general formula (I): $A_2[M_{1-a}Mn_aF_6]$ (in the above-mentioned general formula (I), A is at least one selected from the group consisting of K, Li, Na, Rb, Cs, and NH$_4$; M is at least one element selected from the group consisting of elements of Group 4 and elements of Group 14; and a satisfies 0<a<0.2). Typical examples of the fluoride phosphor include potassium fluorosilicate-based phosphors (such as $K_2SiF_6$: Mn).
(Filler of Sealing Member)

Examples of a filler of the sealing member include silicon dioxide (silica). Silica is preferably as an agent for reducing the thermal expansion coefficient of the sealing member. The shape of the filler of the sealing member is not particularly limited, and may be indefinite (granular), but, from the viewpoint of fluidity, is preferably spherical.
(Wire 150, 250)

The wire is a lead that connects an electrode of the light emitting element and the lead electrode. Specifically, a metal wire made of gold, copper, silver, platinum, aluminum, palladium, or an alloy of them may be used.
(Adhesive Member 160, 260)

The adhesive member is a member configured to fix the light emitting element to the lead electrode. In the light-emitting device of the present invention, the adhesive member is a cured product of the die bonding material of the present invention.

3) Method for Producing Light-Emitting Device

A method for producing the light-emitting device of the present invention is a method for producing a light-emitting device including an element-housing and a light emitting element. The element-housing includes a pair of lead electrodes and a mold integrally formed with the pair of lead electrodes, and has a recess, in which the pair of lead electrodes constitutes the bottom of the recess. The light emitting element is fixed, with an adhesive member, onto at least one of the pair of lead electrodes constituting the bottom of the recess. The method for producing the light-emitting device includes mounting a light emitting element by fixing the light emitting element to at least one of the pair of lead electrodes by using the die bonding material of the present invention.

The light-emitting device obtained by this production method is the same as the above-described light-emitting device of the present invention, and detailed descriptions thereof will be omitted.

In the method for producing the light-emitting device according to the present invention, a known method may be suitably applied to any step other than the step of mounting the light emitting element.

The step of mounting the light emitting element may be performed, for example, by applying the die bonding material to at least one of the pair of lead electrodes, disposing the light emitting element on the die bonding material (applied coating), and curing the die bonding material at a temperature of 130° C. or higher and 140° C. or lower.

The amount of the die bonding material of the present invention to be applied is not particularly limited. The amount of the die bonding material to be applied is such that the thickness of coating of the die bonding material is normally 0.5 μm to 5 μm, and preferably 1 μm to 3 μm.

Although depending on the die bonding material to be used or the like, the heating temperature for heat-curing the die bonding material is preferably 130° C. or higher and 140° C. or lower. The heating time is normally 10 minutes to 20 hours, and preferably 30 minutes to 10 hours.

EXAMPLES

Hereinafter, examples according to the present invention will be described in detail. It is needless to say that the present invention is not limited only to the following examples.

Production Example 1

In a 300-mL eggplant flask, 17.0 g (77.7 mmol) of 3,3,3-trifluoropropyltrimethoxysilane and 32.33 g (181.3 mmol) of methyltriethoxysilane were charged, and while stirring the resulting mixture, an aqueous solution prepared by dissolving 0.0675 g of 35% by mass hydrochloric acid (the HCl amount of 0.65 mmol, 0.25 mol % based on the total amount of a silane compound) in 14.0 g of distilled water was added thereto, and the whole content was stirred at 30° C. for 2 hours, subsequently heated to 70° C., and stirred for 20 hours.

While continuously stirring the whole content, a mixed solution of 0.0394 g of 28% by mass aqueous ammonia (the NH$_3$ amount of 0.65 mmol) and 46.1 g of propyl acetate was added thereto to obtain a reaction liquid having pH 6.9, and the reaction liquid was stirred at 70° C. for 60 minutes.

The reaction liquid was allowed to cool down to room temperature, and then, 50 g of propyl acetate and 100 g of water were added to the reaction liquid to effect liquid separation, so that an organic layer including a reaction product was obtained. Magnesium sulfate was added to the organic layer, and the resulting mixture was subjected to drying. The magnesium sulfate was filtered and removed, then the resulting organic layer was condensed by an evaporator, and subsequently the resulting concentrate was vacuum dried, so that a curable polysilsesquioxane compound (1) [curable PSQ (1)] was obtained.

Production Example 2

In a 300-mL eggplant flask, 71.37 g (400 mmol) of methyltriethoxysilane was charged, and while stirring, an aqueous solution prepared by dissolving 0.1 g of 35% by mass hydrochloric acid (0.25 mol %, based on the total amount of a silane compound) in 21.6 g of distilled water was added thereto, and the whole content was stirred at 30° C. for 2 hours, subsequently heated to 70° C., and stirred for 5 hours.

While continuously stirring the whole content, 140 g of propyl acetate and 0.12 g of 28% by mass aqueous ammonia (0.5 mol % of NH$_3$, based on the total amount of the silane compound) was added thereto, and stirred at 70° C. for 3 hours.

The resulting reaction liquid was allowed to cool down to room temperature, and then an organic layer was washed with purified water until the pH of an aqueous layer reached 7.

The organic layer was condensed by an evaporator, and the resulting concentrate was vacuum dried, so that a curable polysilsesquioxane compound (2) [curable PSQ (2)] was obtained.

[Measurement of Mass Average Molecular Weight]

The mass average molecular weight (Mw) of each of the curable polysilsesquioxane compounds was measured by the following apparatus under the following conditions.

Apparatus name: HLC-8220 GPC, manufactured by Tosoh Corporation
    Column: a column prepared by sequentially connecting TSKgel GMHXL, TSKgel GMHXL, and TSKgel 2000HXL
    Solvent: tetrahydrofuran
    Standard substance: polystyrene
    Injection volume: 20 μl
    Measurement temperature: 40° C.
    Flow rate: 0.6 ml/min
    Detector: differential refractometer

[$^{29}$Si-NMR Measurement]

The NMR of each of the curable polysilsesquioxane compounds was measured by the following apparatus under the following conditions.

Apparatus name: AV-500, manufactured by Bruker Bio-Spin K.K.
    $^{29}$Si-NMR resonance frequency: 99.352 MHz
    Probe: 5 mmφ solution probe
    Measurement temperature: room temperature (25° C.)
    Sample rotational speed: 20 kHz
    Measurement method: inverse-gated decoupling
    $^{29}$Si flip angle: 90°
    $^{29}$Si 90° pulse width: 8.0 μs
    Repetition time: 5 s
    Integration count: 9,200 times
    Observation width: 30 kHz <Method for Preparing $^{29}$Si-NMR Sample>

For reducing a relaxation time, Fe(acac)$_3$ was added as a relaxation reagent to perform a measurement.

Polysilsesquioxane concentration: 15% by mass
    Fe(acac)$_3$ concentration: 0.6% by mass
    Measurement solvent: acetone
    Internal standard: TMS <Waveform Analysis>

The chemical shifts of peaks in a spectrum after Fourier transformation were determined using positions of peak tops, and integration was carried out.

The physical properties of the curable polysilsesquioxane compounds (1) and (2) are as follows.

TABLE 1

|  | Mass average molecular weight (Mw) | $^{29}$Si-NMR measurement | |
| --- | --- | --- | --- |
|  |  | Z2 value | Z3 value |
| Curable PSQ (1) | 5,900 | 28% | 70% |
| Curable PSQ (2) | 9,500 | 17% | 83% |

[Refractive Index Measurement]

A die bonding material obtained in Example 1 or Reference Example 1 was discharged onto a level surface, and a measuring surface of a pen refractometer (PEN-RI, manufactured by ATAGO CO., LTD,) was press-bonded thereto at 25° C. to measure a refractive index (nD).

[Solid-State Si-NMR Measurement]

A cured product obtained by heating the die bonding material (1) obtained in Example 1 at 170° C. for 2 hours was subjected to a solid-state Si-NMR measurement under the following conditions.

Apparatus name: AV-500, manufactured by Bruker Bio-Spin K.K.
    $^{29}$Si-NMR resonance frequency: 99.352 MHz
    Probe: 7.0 mmφ CP-MAS probe
    External standard: hexamethylcyclotrisiloxane (−9.66 ppm)
    Measurement temperature: 25° C.
    Sample rotational speed: 4 kHz
    Measurement method: pulse program hpdec (high-power decoupling)
    $^{29}$Si 90° pulse width: 5.5 μs
    Repetition time: 600 s
    Integration count: 128 times
    Observation width: 30 kHz
    Broadening factor: 20 Hz <Data Processing Method>

When performing the solid-state Si-NMR measurement, measurement data was captured with a time domain size of 1,024, and subjected to zero filling to 8,192 points and Fourier transformation.

<Curve Fitting Analysis>

The peaks in a spectrum after the Fourier transformation were subjected to optimization calculations in accordance with a nonlinear least squares method using, as variable parameters, the chemical shift, the height, and the half-width of the shape of each of the peaks, and the component ratio of a Gaussian waveform and a Lorentzian waveform.

Example 1

To 100 parts by mass of the curable polysilsesquioxane compound (1) obtained in Production Example 1, 20 parts by mass of a silica filler having an average primary particle diameter of 7 nm and 10 parts by mass of a silicone filler having an average primary particle diameter of 0.8 μm were added. Furthermore, to the mixture, 30 parts by mass of a mixed solvent of diethylene glycol monobutyl ether acetate: tripropylene glycol-n-butyl ether=40:60 (mass ratio) was added as a solvent, and subsequently the whole content was stirred.

The whole content was subjected to dispersion processing using a three-roll mill, and subsequently, 30 parts by mass of 1,3,5-N-tris[(3-trimethoxysilyl)propyl] isocyanurate, 3 parts by mass of 3-(trimethoxysilyl)propyl succinic anhydride, and a mixed solvent of diethylene glycol monobutyl ether acetate: tripropylene glycol-n-butyl ether=40:60 (mass ratio) as a solvent were added thereto, and the whole content was sufficiently mixed and defoamed to obtain the die bonding material (1) having a solid content of 82% by mass. The refractive index of the die bonding material (1) was 1.425.

Table 2 lists results of a solid-state Si-NMR measurement of a cured product of the die bonding material (1).

TABLE 2

| Chemical shift (ppm) | −65.3 | −56.9 |
|---|---|---|
| Half width (Hz) | 608.5 | 513.1 |

Reference Example 1

The die bonding material (2) having a solid content of 82% by mass was obtained in the same manner as in Example 1, except that the curable polysilsesquioxane compound (2) obtained in Production Example 2 was used in place of the curable polysilsesquioxane compound (1). The refractive index of the die bonding material (2) was 1.435.

Example 2

A light-emitting device of Example 2 is a side-face light emission type LED having a structure of the light-emitting device 1100 exemplarily illustrated in FIGS. 1 to 4. The size of the light-emitting device (element-housing) is 3.0 mm in width (width in the right-left direction), 0.85 mm in depth (width in the front-rear direction), and 0.4 mm in thickness (width in the up-down direction).

The element-housing 110 is configured such that the mold 115 is integrally formed with the first lead electrode 111 (negative electrode) and the second lead electrode 112 (positive electrode). The element-housing 110 includes, in the front face thereof, the recess 110a having a width of 2.2 mm, a length of 0.29 mm (0.19 mm at right and left narrow width portions), and a depth of 0.3 mm. The mold 115 contains a white pigment of titanium oxide (30% by mass) and a fibrous filler of calcium silicate (wollastonite; 15% by mass), in a base material made of 9C nylon resin. The mold 115 is formed by injection molding, and has the gate trace 115a at the approximate center of the rear face (of the rear formation part). Each of the first lead electrode 111 and the second lead electrode 112 is a 0.11-mm-thick metal fragment obtained by silver-plating on a copper alloy main body with a sulfur-based brightener. A surface of the mold 115 constitutes the side wall of the recess 110a. A surface of the mold 115 and surfaces of the first lead electrode 111 and the second lead electrode 112 constitute the bottom of the recess 110a. The portion of the first lead electrode 111 that constitutes the bottom of the recess 110a is the first element mounting section 111a. The first lead electrode 111 and the second lead electrode 112 have the first external connection terminal 111b and the second external connection terminal 112b as portions outside the mold 115, respectively. The first external connection terminal 111b and the second external connection terminal 112b extend from the lower surface of the mold 115 and are bent along the lower surface, and furthermore bent along the left edge surface and the right edge surface, respectively.

The mold 115 has the reinforcing sections 117 respectively provided in the two side walls 1151 and 1152 facing each other in the longitudinal direction of the recess 110a. The reinforcing sections 117 are disposed in the separator region 1150 configured to separate the first lead electrode 111 and the second lead electrode 112. Three slopes constitute surfaces of each of the two reinforcing sections 117. The two reinforcing sections 117 are each 0.15 mm in height.

The light emitting element 121 is accommodated in the recess 110a of the element-housing. This light emitting element 121 is an approximately rectangular parallelepiped LED chip having a length of 0.2 mm, a width of 0.75 mm, and a thickness of 0.15 mm and capable of emitting blue light (having a light emission peak wavelength of approximately 455 nm), in which an n-type layer, an active layer, and a p-type layer, each being made of a nitride semiconductor, are sequentially laminated on a sapphire substrate. The light emitting element 121 is fixed onto the first element mounting section 111a with the adhesive member 160. The n electrode of the light emitting element 121 and the first element mounting section 111a are connected by the wire 150. The p electrode of the light emitting element 121 and the second lead electrode 112 are connected by the wire 150. In the light-emitting device of the present invention, the adhesive member 160 is a cured product of the die bonding material (1) of Example 1. The wire 150 is a silver-gold alloy wire (approximately 98% of silver/approximately 2% of gold) having a wire diameter of 25 μm.

In the recess 110a of the element-housing, the sealing member 130 is filled to cover the light emitting element 121. The sealing member 130 contains methyl phenyl silicone resin as a base material, and contains the wavelength conversion substance 140 including a first phosphor capable of emitting green light (having a light emission peak wavelength of approximately 540 nm) as a βsialon-based phosphor and a second phosphor capable of emitting red light (having a light emission peak wavelength of approximately 630 nm) as a potassium fluorosilicate-based phosphor. The front face of the sealing member 130 is approximately the same plane (a slightly recessed surface due to cure shrinkage) as the front face of the mold 115. In the sealing member 130, a large amount of the wavelength conversion substance 140 is present on the bottom side of the recess 110a.

Example 3

A light-emitting device of Example 3 is a side-face light emission type LED having a structure of the light-emitting device 2100 exemplarily illustrated in FIGS. 5 to 8. The size of the light-emitting device (element-housing) is 4.2 mm in width (width in the right-left direction), 1.0 mm in depth (width in the front-rear direction), and 0.6 mm in thickness (width in the up-down direction). The light-emitting device 2100 according to Example 3 is substantially the same as the light-emitting device 1100 according to Example 2, except the shape of the element-housing 210, the shapes of the first lead electrode 211 and the second lead electrode 212, the arrangement of the two light emitting elements 221 (the first light emitting element 221 and the second light emitting element 221), the composition of the wire 250, and the shape of the reinforcing section 217. Therefore, hereinafter, descriptions will be given of only differences in the light-emitting device 2100 and the element-housing 210 from the light-emitting device 1100 and the element-housing 110, and descriptions about the other points will be omitted.

The element-housing 210 is configured such that the mold 215 is integrally formed with the first lead electrode 211 (negative electrode) and the second lead electrode 212 (positive electrode). The element-housing 210 includes, in the front face thereof, the recess 210a having a width of 3.6 mm, a length of 0.46 mm (0.36 mm at right and left narrow width portions), and a depth of 0.3 mm. The portions of the first lead electrode 211 and the second lead electrode 212 that constitute the bottom of the recess 210a are the first element mounting section 211a and the second element mounting section 212a, respectively.

The mold 215 has the reinforcing section 217 configured to connect the two side walls 2151 and 2152 facing each other in the longitudinal direction of the recess 210a. The reinforcing section 217 is disposed in the separator region 2150 configured to separate the first lead electrode 211 and the second lead electrode 212, and at the approximate center in the lateral direction of the recess 210a. The shape of the reinforcing section 217 is rectangular (wide linear) when viewed in front, and trapezoidal when viewed in section.

The two light emitting elements 221 (the first light emitting element 221 and the second light emitting element 221) are accommodated in the recess 210a of the element-housing. This light emitting element 221 is an approximately rectangular parallelepiped LED chip having a length of 0.24 mm, a width of 0.85 mm, and a thickness of 0.12 mm and capable of emitting blue light (having a light emission peak wavelength of approximately 455 nm), in which an n-type layer, an active layer, and a p-type layer, each being made of a nitride semiconductor, are sequentially laminated on a sapphire substrate. The first light emitting element 221 and the second light emitting element 221 are fixed onto the first element mounting section 211a and the second element mounting section 212a with the adhesive member 260, respectively. The n electrode of the first light emitting element 221 and the first element mounting section 211a are connected by the wire 250. The p electrode of the first light emitting element 221 and then electrode of the second light emitting element 221 are connected by the wire 250. The p electrode of the second light emitting element 221 and the second element mounting section 212a are connected by the wire 250. In the light-emitting device of the present invention, the adhesive member 260 is a cured product of the die bonding material (1) of Example 1. The wire 250 is a silver-gold alloy wire (approximately 80% of silver/approximately 20% of gold) having a wire diameter of 25 μm.

<Evaluation 1: Light Flux of Light-Emitting Device>

Using the die bonding material (1) of Example 1 as a material for forming an adhesive member, the light-emitting device 1100 described in Example 2 and the light-emitting device 2100 described in Example 3 were prepared as Samples 1 and 2, respectively. Furthermore, using the die bonding material (2) of Reference Example 1 as a material for forming an adhesive member, the light-emitting device 1100 described in Example 2 and the light-emitting device 2100 described in Example 3 were prepared as Reference Examples 2 and 3, respectively. Here, curing conditions for the die bonding materials were 135° C. and 100 minutes for the die bonding material (1) and 150° C. and 100 minutes for the die bonding material (2). The initial light flux of each of Samples 1 and 2 and Reference Examples 2 and 3 was measured using an integrating sphere manufactured by LABSPHERE, INC. As a result, the light flux of Sample 1 using the die bonding material (1) was higher by 0.2% than that of Reference Example 2. The light flux of Sample 2 using the die bonding material (1) was higher by 0.7% than that of Reference Example 3.

<Evaluation 2: Die Shear Strength of Adhesive Member>

Using the die bonding material (1) of Example 1, the die bonding material (2) of Reference Example 1, an epoxy-modified resin, and a dimethyl-based resin as materials for forming adhesive members (hereinafter, referred to as "the die bonding material or the like" in some cases), production intermediates for the light-emitting device 1100 described in Example 2 were prepared as Sample 3, Reference Example 4, and Comparative Examples 1 and 2, respectively. Specifically, a die bonding material or the like was applied onto a lead electrode, and a light emitting element was disposed on the die bonding material or the like (applied coating), and subsequently the die bonding material or the like was cured (mounted). Here, curing conditions for the die bonding material or the like were 135° C. and 100 minutes for the die bonding material (1), 150° C. and 100 minutes for the die bonding material (2), 170° C. and 90 minutes for the epoxy-modified resin, and 150° C. and 100 minutes for the dimethyl-based resin. The die shear strength of each of Sample 3, Reference Example 4, and Comparative Examples 1 and 2 at a stage temperature set at 150° C. was measured. A bonding tester PTR1000 (manufactured by RHESCA Co., LTD.) was used as a measurement apparatus, and a 2-kgf sensor was used. A shear velocity of 0.3 mm/sec was adopted. The height of a tool was 35 μm. The average of measured values was taken as a relative value, and compared with Reference Example 4 as a standard. Note that the light emitting element used in Evaluation 2 was an approximately rectangular parallelepiped having a length of 0.21 mm, a width of 0.8 mm, and a thickness of 0.15 mm.

As a result, when the strength relative value of Reference Example 4 was taken as 100%, the die shear strength of Comparative Example 2, that is, the dimethyl-based resin, was 55.1%, and the die shear strength of Comparative Example 1, that is, the epoxy-modified resin, was 75.2%. In contrast, the die shear strength of Sample 3 was 103.5%, and thus, although the curing temperature for the adhesive member in Sample 3 was lower by 15° C. than in Reference Example 4, Sample 3 had higher die shear strength than Reference Example 4.

<Evaluation 3: Contamination Check of Positive/Negative (pn) Electrodes of Light Emitting Element>

Using the die bonding material (1) of Example 1, the die bonding material (2) of Reference Example 1, an epoxy-modified resin, and a dimethyl-based resin as materials for forming adhesive members, production intermediates for the light-emitting device 1100 described in Example 2 were prepared as Sample 4, Reference Example 5, and Comparative Examples 3 and 4, respectively. Specifically, the die bonding material or the like was applied onto a lead electrode, and a light emitting element was disposed on the die bonding material or the like (applied coating). Note that, as is the case with Evaluation 2, the light emitting element used in Evaluation 3 was an approximately rectangular parallelepiped having a length of 0.21 mm, a width of 0.8 mm, and a thickness of 0.15 mm, and no wire, no sealing member, and no external connection terminal were provided. Next, Sample 4, Reference Example 5, and Comparative Examples 3 and 4 were wrapped in aluminum foil, and steam-baked at 135° C. for 100 minutes for Sample 4, at 150° C. for 100 minutes for Reference Example 5, at 170° C. for 90 minutes for Comparative Example 3, and at 150° C. for 100 minutes for Comparative Example 4, respectively, so that the die bonding material or the like was cured. Subsequently, whether a pair of positive/negative (pn) electrodes of the light emitting element was discolored was checked by a metallographic microscope BX60 (manufactured by Olympus Corporation).

As a result, it was observed that the pair of positive/negative (pn) electrodes in Comparative Example 4, that is, the dimethyl-based resin, was discolored. In contrast, it was confirmed that the pair of positive/negative (pn) electrodes in each of Sample 4, Reference Example 5, and Comparative Example 3 did not discolor. Thus, it was found that, in each of Sample 4, Reference Example 5, and Comparative Example 3, a volatilization component of a corresponding one of the die bonding materials did not contaminate the positive/negative electrodes of a corresponding one of the light emitting elements through the heat-treatment under the conditions.

<Evaluation 4: Resin Reflectivity of Mold of Element-Housing>

The reflectivity of the 9C nylon resin containing a white pigment of titanium oxide and a fibrous calcium silicate (wollastonite) and serving as a material for the mold of the element-housing was checked before and after each of the die bonding material (1) of Example 1 and the die bonding material (2) of Reference Example 1 was subjected to heat-treatment at a corresponding one of the curing temperatures. Specifically, the curing temperatures were 135° C. for the die bonding material (1) and 150° C. for the die bonding material (2). As the thermoplastic resin, 4-mm-thick thin film plates having 35% by mass of the amount of titanium oxide added and 10% by mass of the amount of wollastonite added (Sample 5: 135° C., Reference Example 6: 150° C.) and 0.4-mm-thick thin film plates having 30% by mass of the amount of titanium oxide added and 15% by mass of the amount of wollastonite added (Sample 6: 135° C., Reference Example 7: 150° C.) were used. First, the initial reflectivity at a wavelength of 450 nm of each of the samples and the reference examples was measured using CMS-35SP (manufactured by MURAKAMI COLOR RESEARCH LABORATORY). Next, while a face whose initial reflectivity had been measured was turned up, each of the samples and the reference examples was heat-treated at 135° C. or 150° C. in an oven. Subsequently, the reflectivity at a wavelength of 450 nm was measured again in the same manner as above to check how much the reflectivity had decreased compared with the initial reflectivity. Table 3 lists the results. Thus, the degree of deterioration of each of the thermoplastic resins due to heat was determined from the reflectivity before and after the heat-treatment.

TABLE 3

|  | Sample 5 | Sample 6 | Reference Example 7 | Reference Example 6 |
| --- | --- | --- | --- | --- |
| Curing temperature | 135° C. | 135° C. | 150° C. | 150° C. |
| Addition amount of titanium oxide | 35% by mass | 30% by mass | 35% by mass | 30% by mass |
| Addition amount of wollastonite | 10% by mass | 15% by mass | 10% by mass | 15% by mass |
| Thickness of thin film plate | 4 mm | 0.4 mm | 4 mm | 0.4 mm |
| Initial reflectivity | 95.3% | 91.8% | 95.3% | 92.0% |
| Reflectivity after heat treatment | 94.9% | 90.8% | 94.1% | 89.9% |

When a curing temperature was lowered by 15° C., the decrease in reflectivity was suppressed by about 1% point. That is, when forming the adhesive member at a low temperature, deterioration of the thermoplastic resin serving as a material for the mold of the element-housing of the light-emitting device is prevented, which is advantageous for improvement in light flux.

INDUSTRIAL APPLICABILITY

The light-emitting device according to one embodiment of the invention can be used for back light devices for liquid crystal displays, various lighting apparatuses, large-sized displays, various display devices for advertisement, destination guide, and the likes, and projectors, and furthermore, digital video cameras, facsimiles, copy machines, and image reading devices such as scanners.

REFERENCE SIGNS LIST 110, 210 . . . element-housing (110a, 210a . . . recess)
111, 211 . . . first lead electrode
112, 212 . . . second lead electrode
111a, 211a . . . first element mounting section
212a . . . second element mounting section
111b, 211b . . . first external connection terminal
112b, 212b . . . second external connection terminal
115, 215 . . . mold (115a, 215a . . . gate trace, 1150, 2150 . . . separator region, 1151, 1152, 2151, 2152 . . . side wall, 117, 217 . . . reinforcing section)
121, 221 . . . light emitting element
130, 230 . . . sealing member
140, 240 . . . wavelength conversion substance
150, 250 . . . wire
160, 260 . . . adhesive member
1100, 2100 . . . light-emitting device

What is claimed is:

1. A die bonding material comprising the following component (A) and a solvent, and having a refractive index (nD) at 25° C. of 1.41 to 1.43 and a thixotropic index of 2 or more, Component (A): a curable polysilsesquioxane compound having a repeating unit represented by the following formula (a-1) and satisfying the following requirement 1 and requirement 2, $$R^1\text{-D-SiO}_{3/2} \tag{a-1}$$

[wherein $R^1$ represents a fluoroalkyl group represented by a compositional formula: $C_mH_{(2m-n+1)}F_n$; m represents an integer of 1 to 10, and n represents an integer of 2 to (2m+1); and D represents a linking group (excluding an alkylene group) for connecting $R^1$ and Si, or a single bond],

[Requirement 1]

as a result of measuring a $^{29}$Si-NMR of the curable polysilsesquioxane compound, one or two or more peaks are observed in a region [region (2)] of −62 ppm or more and less than −52 ppm, one or two or more peaks are observed in at least one region of a region [region (1)] of −52 ppm or more and less than −45 ppm and a region [region (3)] of −73 ppm or more and less than −62 ppm, and Z2 determined by the following formula is 20% to 40%, $$Z2 = \frac{P2}{P1+P2+P3} \times 100$$

P1: an integrated value in the region (1)
P2: an integrated value in the region (2)
P3: an integrated value in the region (3)

[Requirement 2]

the curable polysilsesquioxane compound has a mass average molecular weight (Mw) of 4,000 to 11,000.

2. The die bonding material according to claim 1, wherein the curable polysilsesquioxane compound has a ratio of the repeating unit represented by the formula (a-1) of 25 mol % or higher, based on a total amount of repeating units.

3. The die bonding material according to claim 1, wherein the curable polysilsesquioxane compound further includes a repeating unit represented by the following formula (a-2), R$^2$SiO$_{3/2}$        (a-2)

[wherein R$^2$ represents an unsubstituted alkyl group having 1 to 10 carbon atoms, or an aryl group having 6 to 12 carbon atoms with or without a substituent].

4. The die bonding material according to claim 3, wherein the curable polysilsesquioxane compound has a ratio of the repeating unit represented by the formula (a-2) of higher than 0 mol % and 75 mol % or lower, based on a total amount of repeating units.

5. The die bonding material according to claim 1, wherein, as a result of measuring the $^{29}$Si-NMR of the curable polysilsesquioxane compound, one or two or more peaks are observed in the region (3), and Z3 determined by the following formula is 60% to 80%, $$Z3 = \frac{P3}{P1+P2+P3} \times 100.$$

6. The die bonding material according to claim 1, further comprising the following component (B):
Component (B): a silane coupling agent having a nitrogen atom in a molecule of the silane coupling agent.

7. The die bonding material according to claim 1, further comprising the following component (C):
Component (C): a silane coupling agent having an acid anhydride structure in a molecule of the silane coupling agent.

8. The die bonding material according to claim 1, further comprising the following component (D):
Component (D): fine particles having an average primary particle diameter of 5 to 40 nm.

9. The die bonding material according to claim 1, the die bonding material satisfies the following requirement 3:

[Requirement 3]

as a result of measuring a solid-state Si nuclear magnetic resonance spectrum of a cured product of the die bonding material, a peak is observed in a region of −80 ppm or more and less than −40 ppm, and a half-width of the peak is 500 Hz or more and 900 Hz or less.

10. A light-emitting device comprising:
an element-housing including a pair of lead electrodes and a mold integrally formed with the pair of lead electrodes, and having a recess, the pair of lead electrodes constituting a bottom of the recess; and
a light emitting element fixed, with an adhesive member, onto at least one of the pair of lead electrodes constituting the bottom of the recess, wherein
the adhesive member is a cured product of the die bonding material according to claim 1.

11. The light-emitting device according to claim 10, wherein the light emitting element has a light emission peak wavelength of 445 nm or more and 465 nm or less.

12. The light-emitting device according to claim 10, wherein the light emitting element contains a nitride semiconductor (In$_x$Al$_y$Ga$_{1-x-y}$N, 0≤x, 0≤y, x+y≤1).

13. A method for producing a light-emitting device that includes:
an element-housing including a pair of lead electrodes and a mold integrally formed with the pair of lead electrodes, and having a recess, the pair of lead electrodes constituting a bottom of the recess; and
a light emitting element fixed, with an adhesive member, onto at least one of the pair of lead electrodes constituting the bottom of the recess,
the method comprising mounting a light emitting element by fixing the light emitting element to at least one of the pair of lead electrodes by using the die bonding material according to claim 1.

14. The method for producing a light-emitting device according to claim 13, wherein the step of mounting the light emitting element includes:
applying the die bonding material to at least one of the pair of lead electrodes;
disposing the light emitting element on the die bonding material; and
curing the die bonding material at a temperature of 130° C. or higher and 140° C. or lower.

15. The method for producing a light-emitting device according to claim 13, wherein the light emitting element has a light emission peak wavelength of 445 nm or more and 465 nm or less.

* * * * *